(12) United States Patent
Hoya et al.

(10) Patent No.: US 6,493,251 B2
(45) Date of Patent: Dec. 10, 2002

(54) FERROELECTRIC MEMORY DEVICE

(75) Inventors: Katsuhiko Hoya, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/948,038

(22) Filed: Sep. 7, 2001

(65) Prior Publication Data

US 2002/0031003 A1 Mar. 14, 2002

(30) Foreign Application Priority Data

Sep. 8, 2000 (JP) .................................... 2000-274222

(51) Int. Cl.[7] ............................................... G11C 11/22
(52) U.S. Cl. ........................ 365/145; 365/210; 365/200
(58) Field of Search ................................. 365/145, 210, 365/200, 65, 203, 196, 149

(56) References Cited

U.S. PATENT DOCUMENTS 6,084,795 A * 7/2000 Nunokawa .................. 365/145
6,198,652 B1 * 3/2001 Kawakubo et al. .......... 257/295
6,278,630 B1 * 8/2001 Yamada ....................... 365/145
6,285,576 B1 * 9/2001 Kang ........................... 365/145

OTHER PUBLICATIONS

R. Ogiwara, et al., "A 0.5–µm, 3–V, 1T1C, 1–Mbit FRAM with a Variable Reference Bit–Line Voltage Scheme using a Fatigue–Free Reference Capacitor", IEEE Journal of Solid–State Circuits. vol. 35. No. 4, Apr. 2000, pp. 545–551.

* cited by examiner

Primary Examiner—David Nelms
Assistant Examiner—Thong Le
(74) Attorney, Agent, or Firm—Banner & Witcoff, Ltd.

(57) ABSTRACT

A series connected unit type ferroelectric memory device is provided, in which a substantially constant read signal margin can be obtained regardless of the position of the selected word line. A memory cell includes a parallel-connected ferroelectric capacitor and cell transistor. Cell blocks each include a plurality of series-connected memory cells arranged between terminals along a pair of bit lines. Some terminals are connected to the bit lines via block selecting transistors. Other terminals are connected to the plate lines. A gate of each cell transistor is connected to a word line. A sense amplifier is connected to the bit lines. When data is read, an offset voltage applying circuit compensates for the imbalance in read signal margin caused by the difference in position of the word line by applying to the bit line an offset voltage which differs depending on the position of the selected word line.

21 Claims, 27 Drawing Sheets

FERROELECTRIC MEMORY DEVICE

CROSS REFERENCE TO RELATED APPLICATION

This application claims benefit of priority under 35 U.S.C. §119 to Japanese Patent Application No. 2000-274222, filed on Sep. 8, 2000, the contents of which are incorporated by reference herein.

BACKGROUND OF THE INVENTION

1. Field of the Invention

The present invention relates to ferroelectric memory devices for storing data in a nonvolatile manner by the use of ferroelectric capacitors, and, more particularly, to a ferroelectric memory device having a cell block formed of series-connected plural unit cells each including a parallel-connected ferroelectric capacitor and a memory cell transistor.

2. Description of Related Art

A ferroelectric memory device stores binary data in a nonvolatile manner in accordance with the value of remanent polarization of a ferroelectric capacitor. Generally, a memory cell of a conventional ferroelectric memory device is formed by series-connecting a ferroelectric capacitor and a transistor, as in the case of a DRAM. However, unlike a DRAM, a ferroelectric memory device stores data by remanent polarization. Accordingly, it is necessary to drive a plate line in order to read out a signal charge to a bit line. Therefore, a ferroelectric memory device requires a plate line driving circuit for driving a plate line. However, in a conventional ferroelectric memory device, a plate line driving circuit takes up significant space.

A cell array arrangement of a ferroelectric memory device, in which the area of a plate line driving circuit can be reduced, has been proposed by Takashima et al. In this arrangement, both sides of a ferroelectric capacitor (C) are connected to a source and a drain of a cell transistor (T) to form a unit cell, and a plurality of such unit cells are series-connected to form a cell block (D. Takashima et al., "High-density chain ferroelectric random memory (CFeRAM)" in Proc. VSLI Symp. June 1997, pp. 83–84). In this series connected TC unit type ferroelectric memory device, a plate line driving circuit can be shared by, e.g., eight unit cells. Therefore, a cell array can be highly integrated.

FIG. 24 shows a configuration of a memory cell array 1 of such a series connected TC unit type ferroelectric memory device. A unit cell MC consists of parallel-connected ferroelectric capacitor C and cell transistor T. In the example of FIG. 24, eight of such unit cells are series-connected to form a cell block MCB. FIG. 24 shows two cell blocks MCB0 and MCB1 connected to a pair of bit lines BBL and BL, respectively.

One end of the cell block MCB0 is connected to the bit line BBL via a block selecting transistor BST0 and one end of the cell block MCB1 is connected to the bit line BL via a block selecting transistor BST1. The other end of the cell block MCB0 is connected to a plate line BPL, and the other end of the cell block MCB1 is connected to a plate line PL. Gates of cell transistors in each cell block are connected to word lines WL0–WL7. A sense amplifier SA for sensing and amplifying read data is connected to the bit lines BL and BBL. Block selecting signals BS0 and BS1 are inputted to gates of the block selecting transistors BST0 and BST1, respectively.

FIG. 25 is a timing chart showing basic operations of such a ferroelectric memory device. In this case, a unit cell stores data as data "1" when the remanent polarization of the ferroelectric capacitor is in a positive state, and store data as data "0" when the remanent polarization of the ferroelectric capacitor is in a negative state. In a standby mode, all the word lines are held to be at "H", the block selecting signals BS0, BS1 are held to be at "L", and the bit lines BL, BBL and the plate lines PL, BPL are held to be at VSS (ground potential). At this time, the terminals of the ferroelectric capacitors C are shunted by the ON-state cell transistors so as to store data stably.

In an active mode, when a unit cell at the side of the bit line BL is selected by, e.g., the word line WL2, the bit line BL is held to be in a floating state to set the word line WL2 to be at "L", and then, the block selecting signal BS1 is held to be at "H", and the electric potential of the plate line PL is raised from VSS (ground potential) to VAA (positive potential). In this way, a voltage is applied to the ferroelectric capacitor of the selected unit cell, and a voltage signal is read to the bit line BL in accordance with whether the data is data "0" or data "1".

The voltage signal read to the bit line BL is detected as a result of a comparison with a reference voltage Vref applied to the bit line BBL, which is paired with the bit line BL. That is, when a sense amplifier activating signal SE is raised, the sense amplifier SA sets the bit line BL to be at VAA if the data "1" is read, and at VSS if the data "0" is read. After that, by deactivating the sense amplifier SA, the read data is rewritten.

In these reading and rewriting operations, when the data "1" is read, a destructive read is performed, and when the data "0" is read, a nondestructive read is performed. That is, when the data "1" is read, the remanent polarization of the ferroelectric capacitor is remarkably reduced due to the addition of a positive voltage from the plate line PL, thereby causing a polarization reversal. After the reading operation, when the voltage of the plate line is lowered, since the bit line is held to be at a high potential by the read data, a reverse voltage of the voltage at the time of the reading operation is applied to the ferroelectric capacitor to perform the rewriting operation until the remanent polarization reaches the +Pr again. When the data "0" is read, no polarization reversal is caused by the plate line voltage. Further, no reversal voltage is applied after the reading operation. Therefore, the rewriting operation is performed while the remanent polarization remains negative.

In the above-described operations, the value of the read signal is determined by the capacitance of the bit line and the characteristic curves of the ferroelectric capacitor. FIG. 26 shows the relationship between the characteristic curves (hysteresis loop) and the value of the read signal. The positive voltage VAA supplied from the plate line side to the ferroelectric capacitor is shown as −VAA on the minus voltage axis, and the positive voltage VAA supplied from the bit line side to the ferroelectric capacitor is shown as VAA on the plus voltage axis. The bit line capacitance is shown as Cb. As shown in FIG. 26, the risings in potential of the bit line at the time of reading "1" data and "0" data can be obtained as the intersections of load lines having the inclination of −Cb and the hysteresis loop. In this case, the risings in voltage of the bit line are shown relative to −VAA.

As is apparent from FIG. 26, the read potentials of the "1" data and "0" data are lowered as the bit line capacitance Cb increases. Therefore, the read signal value, which is the difference between these potentials, also depends on the bit line capacitance Cb. Unlike a typical DRAM, the bit line capacitance dependency of the read signal value reaches the maximum value at a certain value of the bit line capacitance.

A series connected TC unit type ferroelectric memory device has a characteristic that the bit line load capacitance Cb differs depending on the position of the selected word line in the cell block. That is, if the case where a memory cell most distant from the bit line is selected by the word line WL7 is compared with the case where a memory cell closest to the bit line is selected by the word line WL0, the bit line capacitance is greater in the former case since the parasitic capacitances of the unit cells connected to the word lines WL0–WL6 are added as loads.

FIG. 27 shows that the bit line capacitance Cb substantially changes in accordance with the position of the selected word line, thereby changing the read signal value. The read signal potential is lower in the case of selecting the word line WL7 than the case of selecting the word line WL0 for both "1" data and "0" data.

When data is sensed, if one of the pair of bit lines BL, BBL is selected, the other is used as the reference bit line, to which a reference potential Vref is applied, as shown in FIG. 27. The reference potential Vref is set to be at the intermediate value between the read bit line potential in the case of "1" data and the read bit line potential in the case of "0" data. However, as is apparent from FIG. 27, in a series connected TC unit type ferroelectric memory device, if the reference potential Vref is set to be at a constant value, when the selected word line changes from WL0 to WL7, the difference between the read potential and the reference potential Vref is smaller in the case of "1" data, and bigger in the case of "0" data. FIG. 28 shows the relationship between the read potential and the position of the word line. The broken line in FIG. 28 represents the intermediate values between the read potentials in the cases of "1" data and "0" data.

As mentioned previously, in a series connected TC unit type ferroelectric memory device, the load capacitance-of the read memory cell changes in accordance with the position of the selected word line. This results in a problem that if the reference voltage Vref is set to be at a constant value, signal margins of "0" data and "1" data vary depending on the position of the accessed word line.

SUMMARY OF THE INVENTION

Given the above-described circumstances, an object of the present invention is to provide a series connected TC unit type ferroelectric memory device in which a substantially constant read signal margin can be obtained regardless of the word line position.

A ferroelectric memory device according to a first aspect of the present invention includes: a memory cell array in which a unit cell is formed of a ferroelectric capacitor a cell transistor, a source and a drain of the cell transistor being connected to both ends of the ferroelectric capacitor and a gate of the cell transistor being connected to a word line, and a cell block is formed by series-connecting a plurality of unit cells between a first terminal and a second terminal, the first terminal of the cell block being connected to a bit line via a block selecting transistor, and the second terminal of the cell block being connected to a plate line; a sense amplifier for sensing and amplifying a signal read from the ferroelectric capacitor of the unit cell to the bit line; a plate line driving circuit for driving the plate line; and an offset voltage applying circuit for, when data is read and before the sense amplifier is deactivated, applying to the bit line different offset voltages in accordance with the positions of the selected unit cells in the cell block.

In this way, by applying a different offset voltage to the bit line in accordance with the position of the selected unit cell, an imbalance in signal margin due to the parasitic capacitance in the cell block, which is a characteristic of a series connected TC unit type ferroelectric memory device, can be compensated.

A ferroelectric memory device according to a second aspect of the present invention includes: a memory cell array in which a unit cell is formed of a ferroelectric capacitor a cell transistor, a source and a drain of the cell transistor being connected to both ends of the ferroelectric capacitor and a gate of the cell transistor being connected to a word line, and a cell block is formed by series-connecting a plurality of unit cells between a first terminal and a second terminal, the first terminal of the cell block being connected to a bit line via a block selecting transistor, and the second terminal of the cell block being connected to a plate line; a sense amplifier for sensing and amplifying a signal read from the ferroelectric capacitor of the unit cell to the bit line; a plate line driving circuit for driving the plate line; and a precharge circuit for setting internal nodes of the cell block to be at a first potential which is somewhere between signal potentials of binary data read to the bit line in a standby mode.

A ferroelectric memory device according to a third aspect of the present invention includes: a memory cell array in which a unit cell is formed of a ferroelectric capacitor a cell transistor, a source and a drain of the cell transistor being connected to both ends of the ferroelectric capacitor and a gate of the cell transistor being connected to a word line, and a cell block is formed by series-connecting a plurality of unit cells between a first terminal and a second terminal, the first terminal of the cell block being connected to, a bit line via a block selecting transistor, and the second terminal of the cell block being connected to a plate line; a sense amplifier for sensing and amplifying a signal read from the ferroelectric capacitor of the unit cell to the bit line; a plate line driving circuit for driving the plate line; and a dummy cell block for, when data is read, applying a different parasitic capacitance to the reference bit line paired to the bit line to which the selected cell block is connected in accordance with the position of the selected unit cell.

DESCRIPTION OF THE PREFERRED EMBODIMENTS

Hereinafter, preferred embodiments of the present invention will be described with reference to the accompanying drawings.

(First Embodiment)

Figure 1:
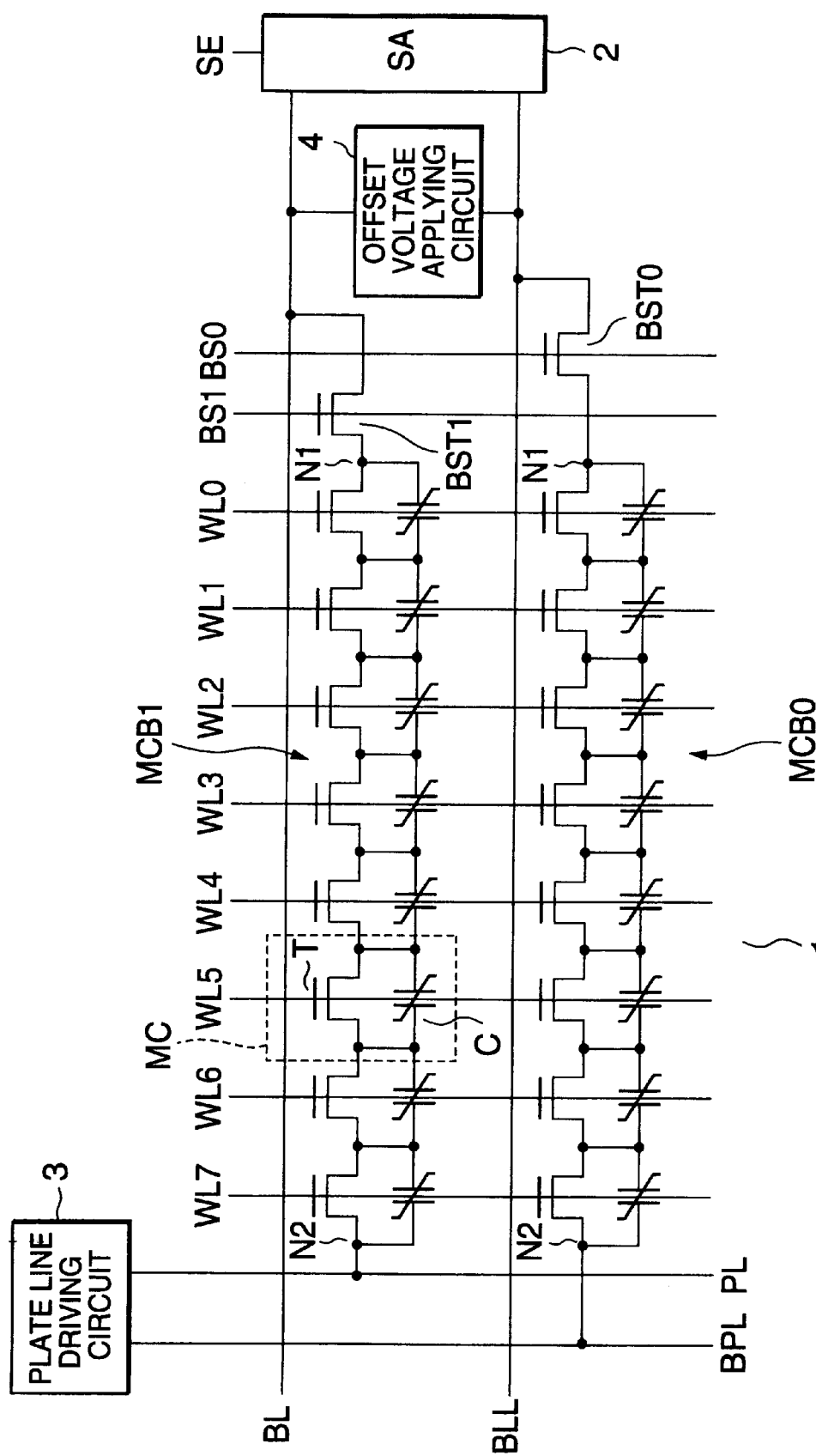
FIG. 1 is an equivalent circuit diagram showing a configuration of a first embodiment of a ferroelectric memory device according to the present invention.
Figure 24:
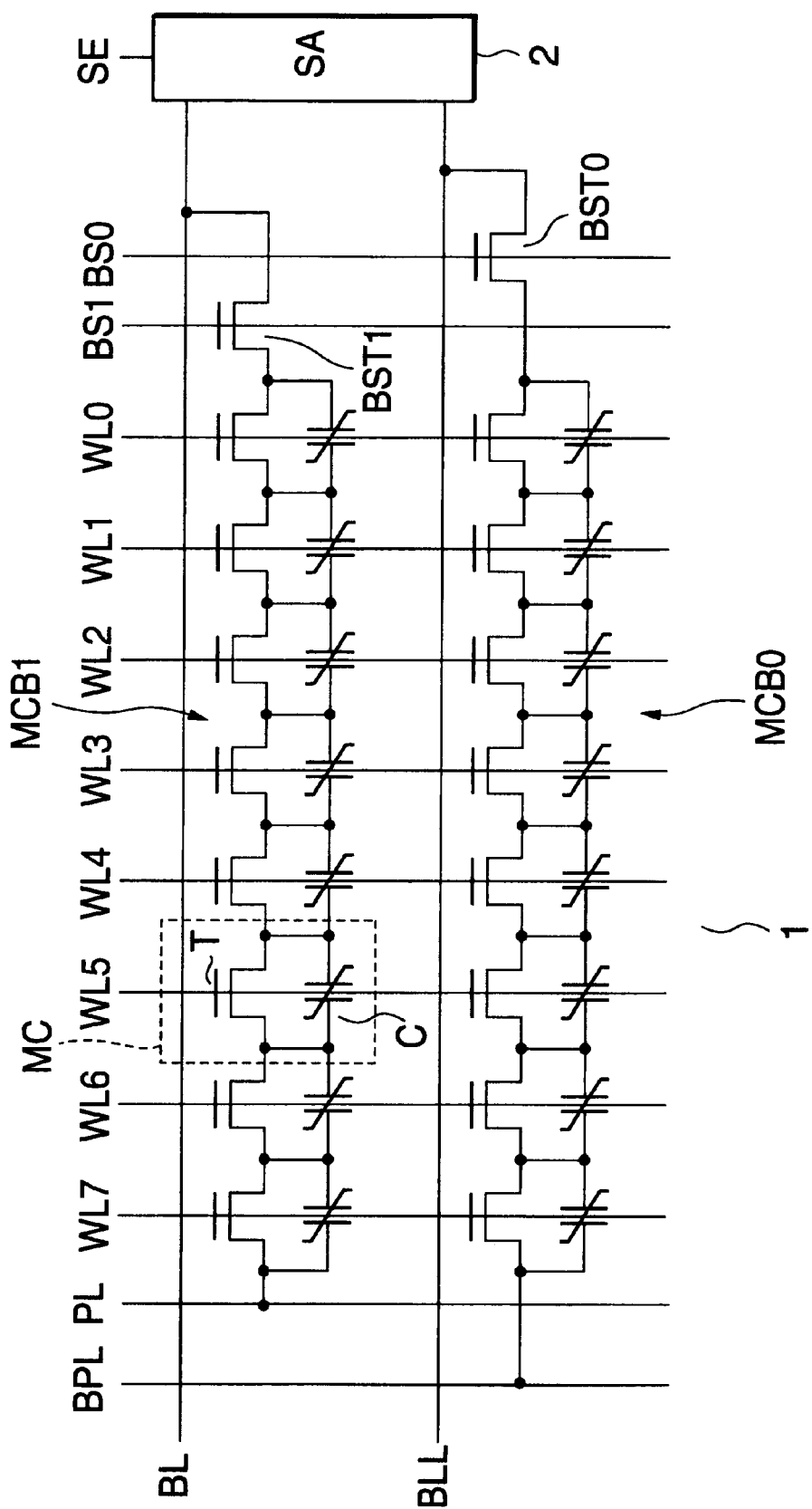
FIG. 24 is an equivalent circuit diagram showing a basic configuration of a series connected TC unit type ferroelectric memory device.
Figure 25:
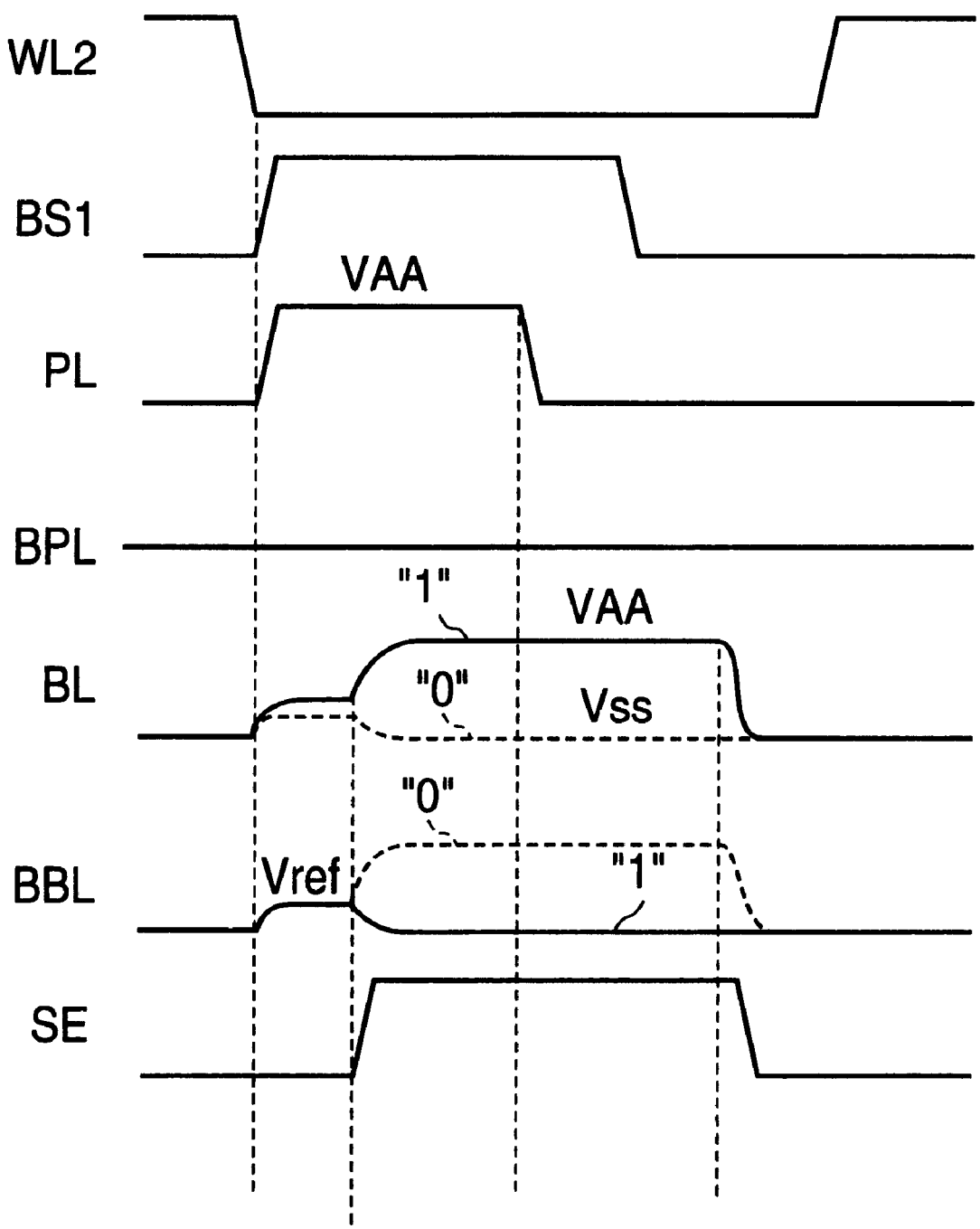
FIG. 25 is a timing chart of the operations of the series connected TC unit type ferroelectric memory device.
Figure 26:
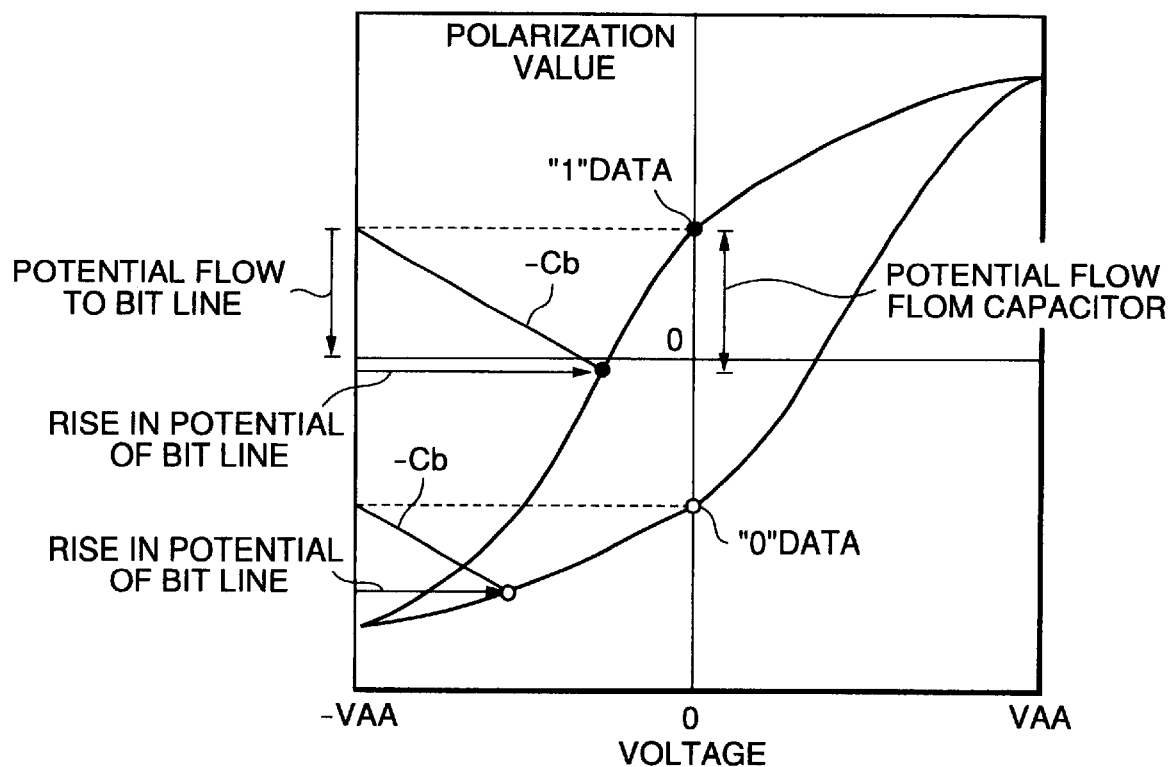
FIG. 26 is a hysteresis characteristics chart for explaining the operation principle of the series connected TC unit type ferroelectric memory device.

FIG. 1 is an equivalent circuit diagram showing the main configuration of a series connected TC unit type ferroelectric memory device (hereinafter referred to as "ferroelectric memory device") according to a first embodiment of the present invention. This ferroelectric memory device is obtained by adding an offset voltage applying circuit 4 to the conventional ferroelectric memory device shown in FIG. 24. That is, the basic configuration of the ferroelectric memory device of the first embodiment is the same as that of the conventional ferroelectric memory device shown in FIG. 24. A unit cell MC includes a cell transistor T and a ferroelectric capacitor C. A source and a drain of the cell transistor T are connected to both ends of the ferroelectric capacitor C. In FIG. 1, eight of such unit cells MC are series-connected between terminals N1 and N2 to form a cell block MCB. FIG. 1 shows two cell blocks MCB0 and MCB1 connected to a pair of bit lines BL and BBL.

One end N1 of the cell block MCB0 is connected to the bit line BBL via a block selecting transistor BST0, and one end N1 of the cell block MCB1 is connected to the bit line BL via a block selecting transistor BST1. The other end N2 of the cell block MCB0 is connected to a plate line BPL, and the other end N2 of the cell block MCB1 is connected to a plate line PL. Gates of the cell transistors in each cell block are connected to word lines WL0–WL7. A sense amplifier 2 (hereinafter also referred to as "SA") for sensing and amplifying read data is connected to the bit lines BL and BBL, and a plate line driving circuit 3 is connected to the plate lines PL and BPL.

In this embodiment, the offset voltage applying circuit 4 for applying a predetermined offset voltage to one of the bit lines BL and BBL in order to compensate for a read signal margin which varies in accordance with the position of the selected word line. Specifically, when data is read, the offset voltage applying circuit 4 applies to one of the bit lines BL and BBL an offset voltage, which varies depending on the position of the selected word line, before the sense amplifier 2 is activated.

Prior to the specific configuration of the offset voltage applying circuit 4, a basic circuit design and the function thereof will be described below.

(Applying Offset Voltage to Selected Bit Line)

The offset voltage generating circuit 4 can be designed to apply an offset voltage to a selected bit line to which data is read. In this case, the value of the offset voltage is selected so that the more distant the position of the selected unit cell in the cell block is from the bit line, the higher the voltage applied is. In this way, it is possible to compensate for the reduction in signal value caused by a parasitic capacitance. Specifically, there are two ways to achieve this: (a) applying a positive offset voltage when a unit cell away from the bit line in the cell block is selected; and (b) applying a negative offset voltage when a unit cell close to the bit line is selected.

Figure 2A:
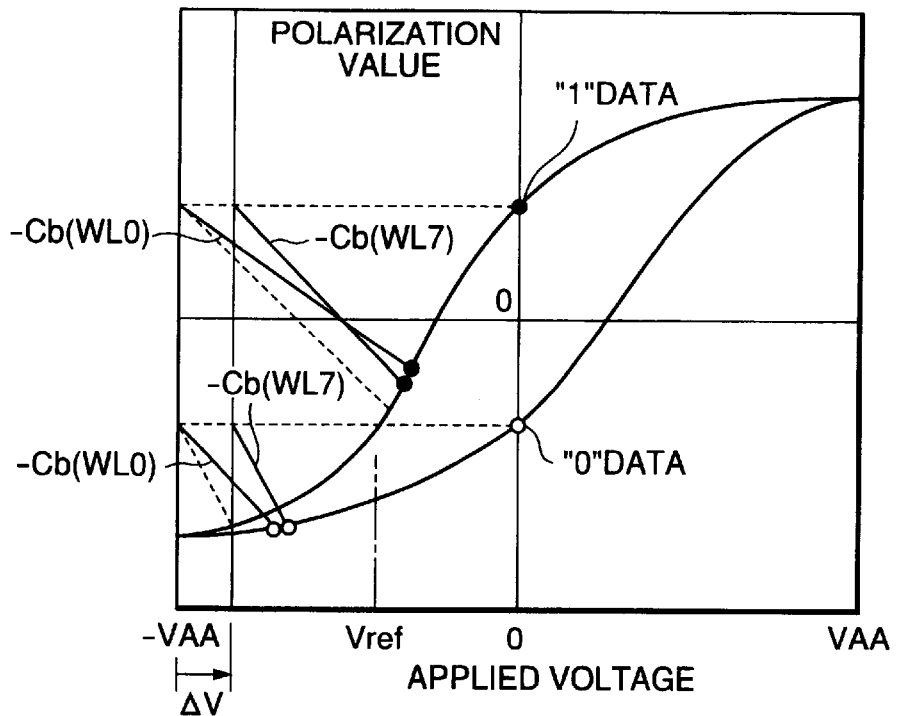
FIG. 2A is a characteristics chart for explaining the principle of a signal imbalance correction method of applying an offset voltage to the selected bit line.

FIG. 2A shows the application of an offset voltage $\Delta V$ in the case of employing the above (a), with reference to the relationship with the hysteresis loop. The simplest way in this case is that the word lines WL0–WL7 is divided into two groups, i.e., WL0–WL3 and WL4–WL7, and when a word line in the former group is selected, the offset voltage ΔV is set to be 0V, and when a word line in the latter group is selected, a positive offset voltage ΔV is supplied.

FIG. 2A shows, as examples, the case where the word line WL0 is selected and the case where the word line WL7 is selected. When the word line WL7 is selected, i.e., when the unit cell most distant from the bit line is selected, a positive offset voltage ΔV is applied to the selected bit line. As mentioned previously and shown in FIG. 2A, the parasitic capacitance connected to the bit line varies depending on the position of the word line. Therefore, the angle of inclination of the load line −Cb(WL0) representing the case where the word line WL0 is selected differs from that of the load line −Cb(WL7) representing the case where the word line WL7 is selected.

When the word line WL7 is selected and a positive offset voltage ΔV is supplied to the selected bit line, as shown in FIG. 2A, the start point of the load line −Cb(WL7) shown by a broken line substantially shifts toward the positive side, and the load line −Cb(WL7) shown by a solid line is substantially achieved. As a result, regardless of whether the data "0" is read or the data "1" is read, there is substantially no difference between the intersection of the load line in the case where the word line WL0 is selected and the hysteresis loop and the intersection of the load line in the case where the word line WL7 is selected and the hysteresis loop. That is, there is substantially no difference in the read signal potentials between the case where the word line WL0 is selected and the case where the word line WL7 is selected.

Figure 2B:
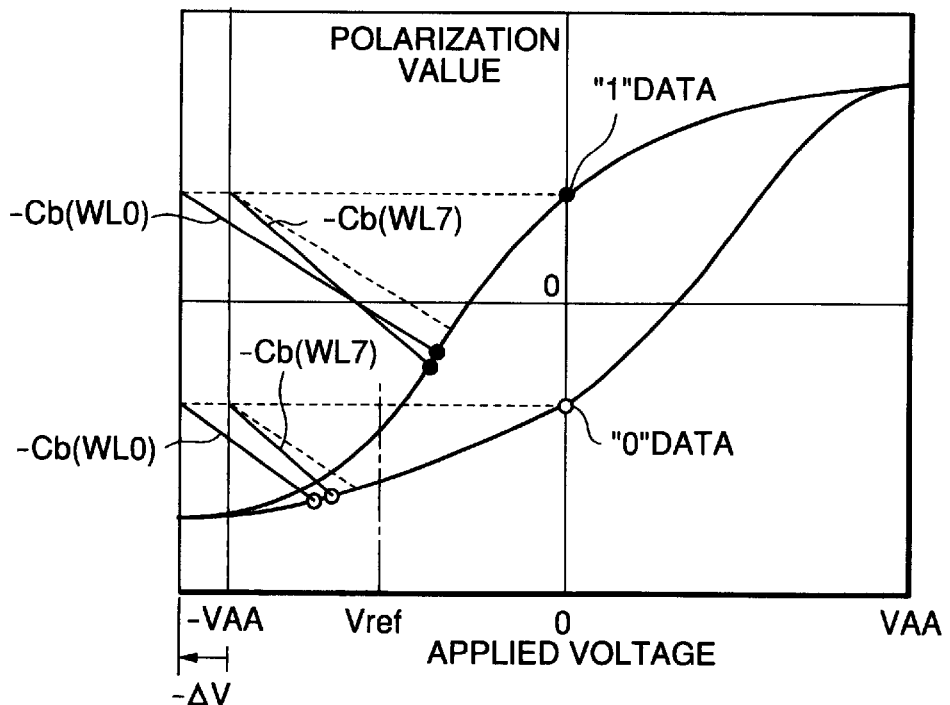
FIG. 2B is a characteristics chart for explaining the principle of another signal imbalance correction method of applying an offset voltage to the selected bit line.

FIG. 2B shows the application of an offset voltage ΔV in the case of employing the above (b), with reference to the relationship with the hysteresis loop. Like FIG. 2A, the case where the word line WL0 is selected and the case where the word line WL7 is selected are shown in FIG. 2B. However, unlike the cases of FIG. 2A, when one of the word lines WL4–WL7 is selected, the offset voltage is set to be 0V, and when one of the word lines WL0–WL3 is selected, a negative offset voltage −ΔV is supplied to the selected bit line. In this way, the start point of the load line −Cb(WL7) substantially shifts toward the negative voltage side. As a result, regardless of whether the data "0" is read or the data "1" is read, there is substantially no difference between the intersection of the load line in the case where the word line WL0 is selected and the hysteresis loop and the intersection of the load line in the case where the word line WL7 is selected and the hysteresis loop. That is, there is substantially no difference in the read signal potentials between the case where the word line WL0 is selected and the case where the word line WL7 is selected.

(Applying Offset Voltage to Reference Bit Line)

The offset voltage applying circuit 4 may be designed to apply an offset voltage to the reference bit line, to which the reference potential Vref is supplied, instead of the selected bit line to which data is read. In this case, the offset voltage may be selected so that the more distant the position of the selected unit cell in the cell block is from the bit line, the lower the offset voltage becomes. Specifically, there are two ways to achieve this: (a) applying a negative offset voltage when a unit cell away from the bit line in the cell block is selected; and (b) applying a positive offset voltage when a unit cell close to the bit line is selected.

Figure 3A:
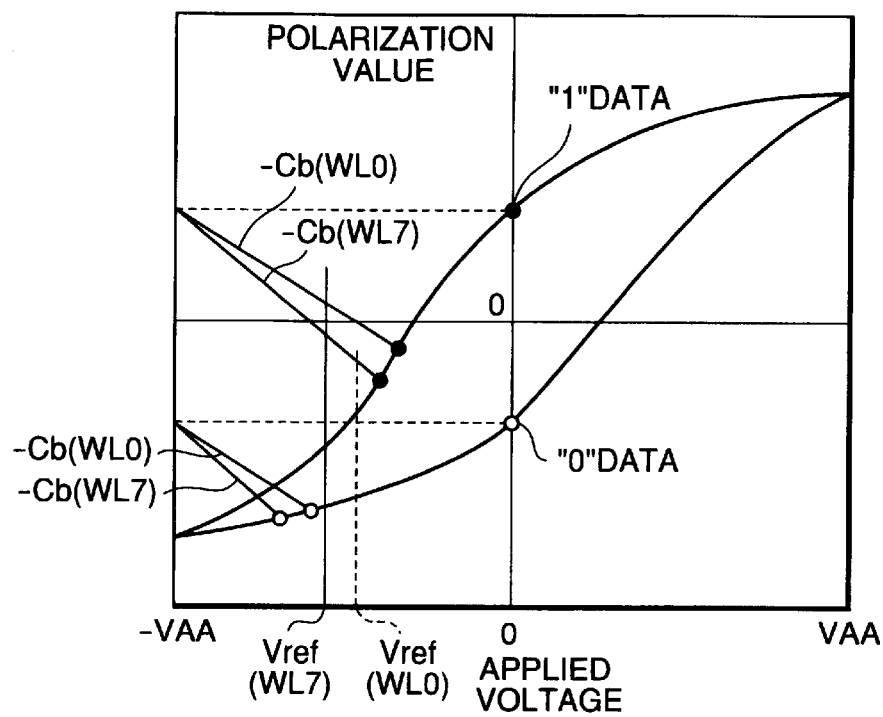
FIG. 3A is a characteristics chart for explaining the principle of a signal imbalance correction method of applying an offset voltage to the reference bit line.

FIG. 3A shows characteristic curves representing the case where the above (a) is employed. In this case also, the simplest way is that the word lines WL0–WL7 is divided into two groups, i.e., WL0–WL3 and WL4–WL7, and when a word line in the former group is selected, a negative offset voltage −ΔV is supplied, and when a word line in the latter group is selected, the offset voltage ΔV is set to be 0V. FIG. 3A also shows, as examples, the case where the word line WL0 is selected, and the case where the word line WL7 is selected. The reference potential Vref(WL7) in the case where the word line WL7 is selected is shifted toward the negative side relative to the reference potential Vref(WL0) in the case that the word line WL0 is selected, shown by a broken line. In this way, the read signal margins of the "1" data and the "0" data in the case where the word line WL0 is selected can be caused to be substantially equivalent to the read signal margins in the case where the word line WL7 is selected.

Figure 3B:
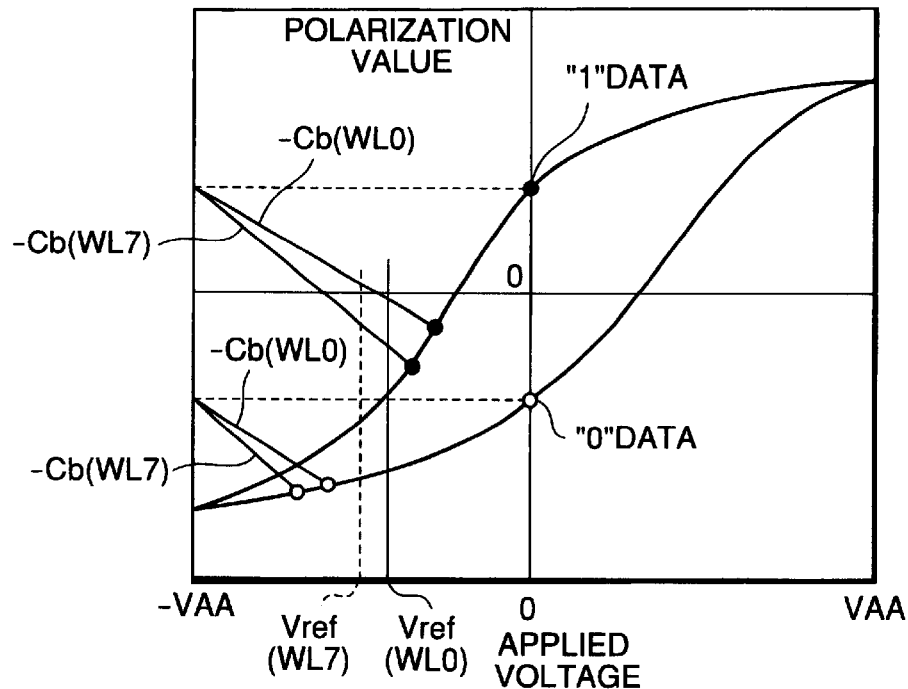
FIG. 3B is a characteristics chart for explaining the principle of another signal imbalance correction method of applying an offset voltage to the reference bit line.

FIG. 3B shows characteristic curves representing the case where the above (b) is employed. In this case, the reference potential Vref(WL0) in the case where the word line WL0 is selected is shifted toward the positive side relative to the reference potential Vref(WL7) in the case where the word line WL7 is selected, shown by a broken line. In this way, as in the case of FIG. 3A, the read signal margins of the "1" data and the "0" data in the case where the word line WL0 is selected can be substantially equivalent to the read signal margins in the case where the word line WL7 is selected.

The offset voltage applying circuit 4 shown in FIG. 1 is for adjusting the bit line potential in accordance with the position of the selected word line. Besides this circuit, a reference potential generating circuit is required to apply a reference potential Vref to one of the bit lines BL, BBL that is not selected.

Figure 4:
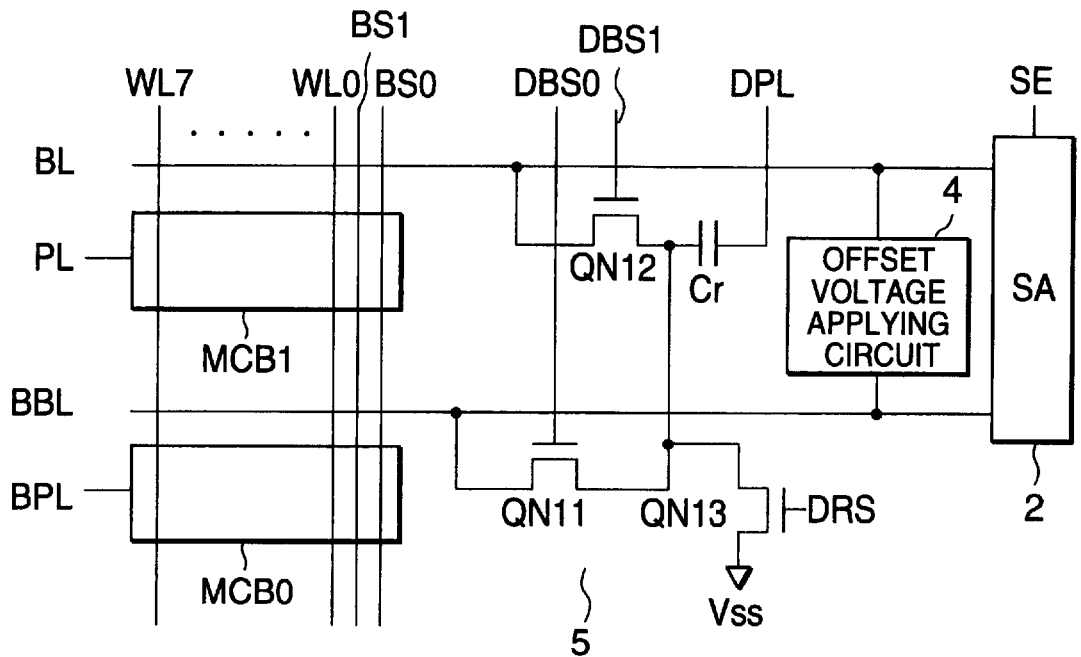
FIG. 4 shows a circuit configuration obtained by adding a reference potential generating circuit to the circuit configuration shown in FIG. 1.

In FIG. 4, a reference potential generating circuit 5 is added to the basic configuration of the present invention shown in FIG. 1. The reference potential generating circuit 5 includes a capacitor Cr, one end of which is connected to a driving line DPL. In a standby mode, the other end of the capacitor Cr is connected to VSS by setting the reset signal DRS, which is inputted to the gate of a resetting NMOS transistor QN13, to be at "H". In an active mode, the other end of the capacitor Cr is selectively connected to the bit line BBL or BL by setting the reset signal DRS to be at "L" and also by setting one of selecting signals DBS0 and DBS1, which are inputted to gates of NMOS transistors QN11 and QN12, respectively, to be at "H", and the other to be at "L". In this way, when data is read, e.g., when data is read to the bit line BL, the node of the capacitor Cr is connected to the bit line BBL. Then, by performing capacitive coupling of the voltage supplied to the driving line DPL by the use of the capacitor Cr, a reference potential Vref is supplied.

Figure 5:
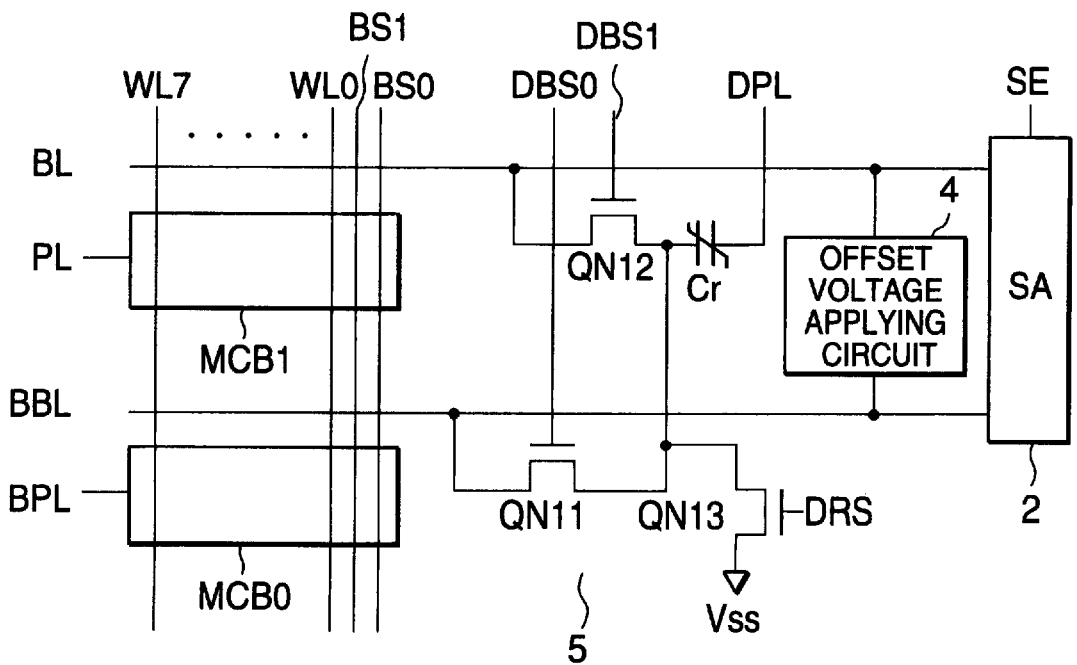
FIG. 5 shows a circuit configuration obtained by adding another reference potential generating circuit to the circuit configuration shown in FIG. 1.

FIG. 5 shows an example in which a ferroelectric capacitor similar to the one included in a memory cell is used as the capacitor Cr of the reference potential generating circuit 5 shown in FIG. 4, instead of a dielectric capacitor. Other configuration of FIG. 5 is the same as that of FIG. 4. In this case, the state of the remanent polarization of the capacitor Cr is similar to the state of the data "0" of the memory cell. However, in order to drive the driving line DPL by the voltage similar to that supplied to the plate line PL to obtain the intermediate value between the read potentials of "0" data and "1" data as the reference potential Vref, for example, the area of the capacitor Cr should be made larger than that of the ferroelectric capacitor C of the cell unit MC.

Figure 6:
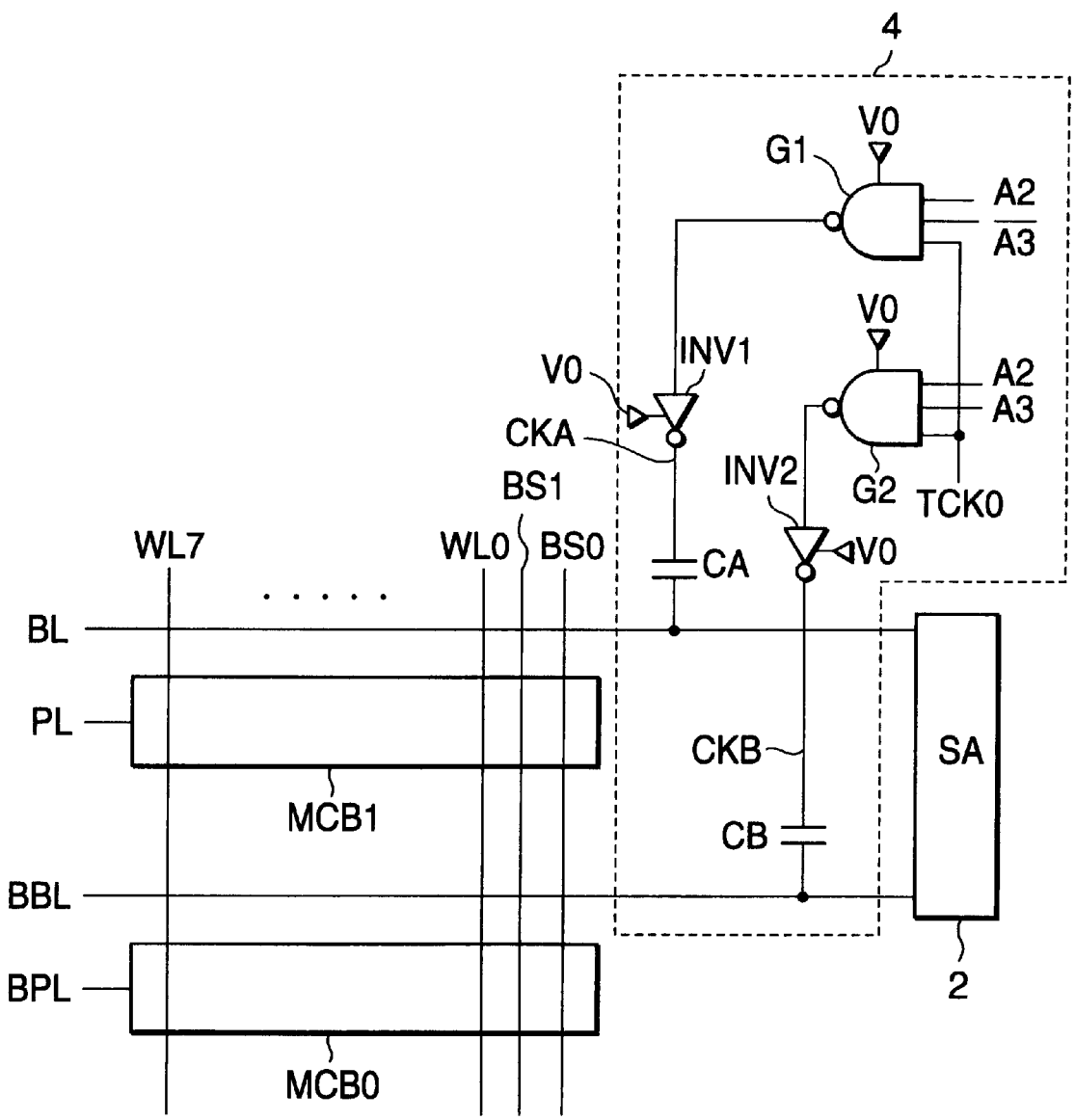
FIG. 6 is an example of circuit configuration specifically showing an offset voltage applying circuit.

FIG. 6 specifically shows the configuration of the offset voltage applying circuit 4 shown in FIGS. 1, 4, and 5. The main part of the offset voltage applying circuit 4 includes capacitors CA and CB for applying an offset voltage to the bit line BL or BBL by capacitive coupling. Driving terminals CKA and CKB of these capacitors CA and CB are selectively driven by their decoding gates, i.e., NAND gates G1 and G2, and inverters INV1 and INV2 provided at the output side of the NAND gates.

In this case, one of the eight word lines WL0–WL7 is selected by three bits A0–A2 of an address, and one of the bit lines BL and BBL (i.e., one of the cell blocks MCB1 and MCB0) is selected by an address bit A3. As a modification of the offset voltage application method described above with reference to FIG. 2A, a method is employed in which no offset voltage is applied to the selected bit line when one of the word lines WL0–WL3 is selected, and an offset voltage is applied when one of the word lines WL4–WL7 is selected.

In order to accomplish this, an activating signal TCK0 and addresses A2 and /A3 are inputted to the NAND gate G1 at the bit line BL side, and the activating signal TCK0 and addresses A2 and A3 are inputted to the NAND gate G2 at the bit line BBL side. That is, the bit line BL side is selected when A3=0, and when A2="1" and /A3="1", by which one of the word lines WL4–WL7 is selected, the output of the NAND gate G1 at the capacitor CA side becomes "L", thereby applying a voltage V0 for generating an offset voltage to the driving terminal CKA. Further, the bit line BBL side is selected when A3=1, and when A2="1" and A3="1", by which one of the word lines WL4–WL7 is selected, the output of the NAND gate G2 at the capacitor CB side becomes "L", thereby applying a voltage V0 for generating an offset voltage to the driving terminal CKB.

Figure 7A:
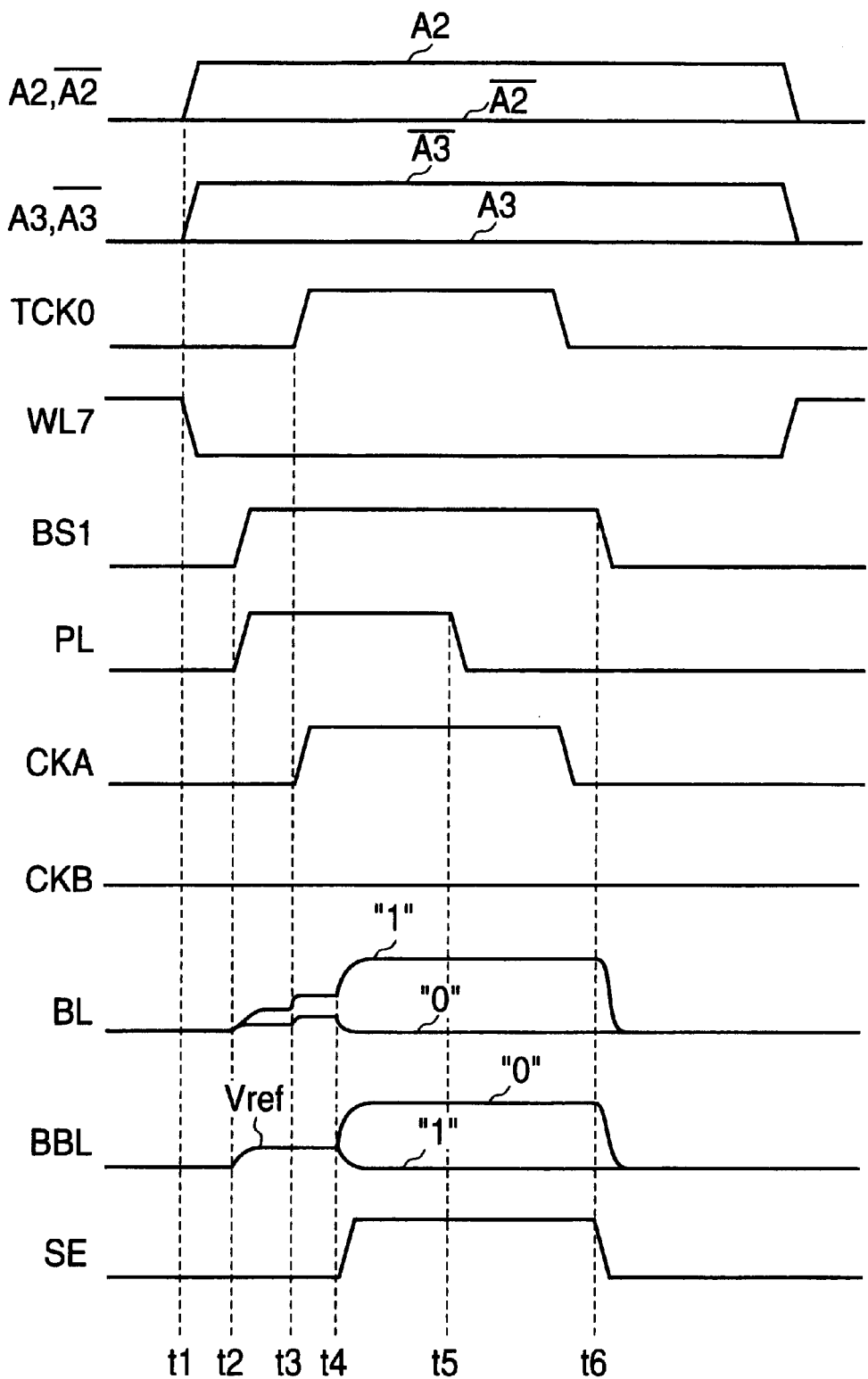
FIG. 7A is an operational timing chart of the case where the offset voltage applying circuit of FIG. 6 is used.

FIG. 7A is a timing chart of the operations of the ferroelectric memory device when the cell block MCB1 is selected, and the word line WL7 is selected by A2="1" and /A3="1". The word line WL7 is selected (time t1), and the block selecting signal BS1 for selecting the cell block MCB1 is set to be at "H" to set the plate line PL to be at "H" (time t2), and the activating signal TCK0 is set to be at "H", thereby activating the NAND gate G1 to output the driving signal CKA (time t3).

In this way, an offset voltage is applied via the capacitor CA to the bit line BL, to which data is read. Then, the sense amplifier 2 is activated (time t4) to sense and amplify the "1" data and "0" data. After that, the plate line PL is set to be at "L" (time t5), and after the read data is rewritten, the sense amplifier 2 is deactivated (time t6). The same operations are performed when any of the word lines WL4, WL5, and WL6 are selected.

Figure 7B:
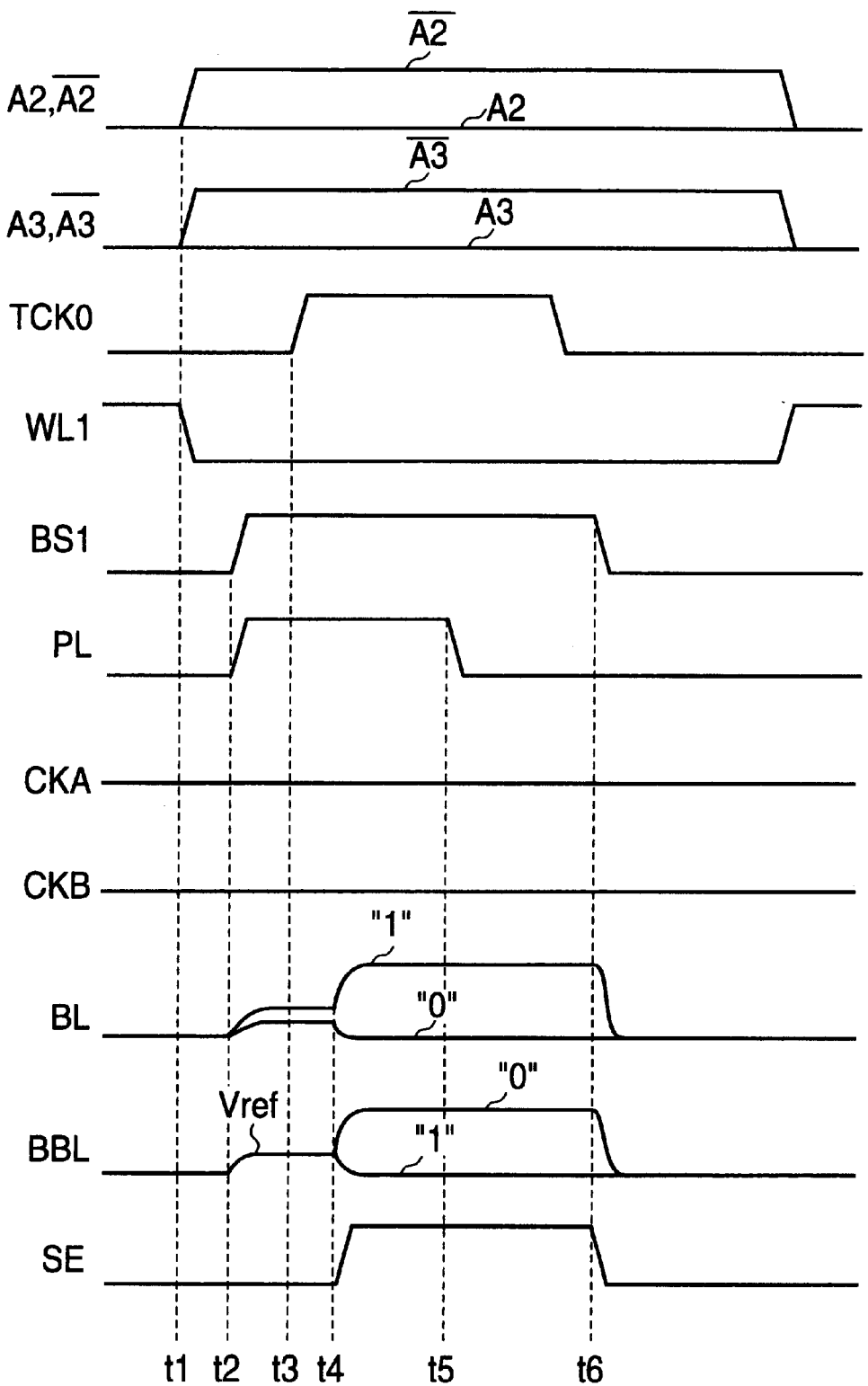
FIG. 7B is another operational timing chart of the case where the offset voltage applying circuit of FIG. 6 is used.

FIG. 7B is a timing chart representing the case where the cell block MCB1 is selected and the word line WL1 is selected by /A2="1" and /A3="1". Unlike the case shown by FIG. 7A, no driving voltage is supplied to the driving terminals CKA and CKB at time t4. Further, no off set voltage is supplied to the selected bit line BL. The same operations are performed when any of the word lines WL0, WL2, and WL3 are selected.

Thus, when the group of unit cells more distant from the bit line BL is selected, an offset voltage is supplied to the bit line BL. Accordingly, as mentioned previously, the imbalance in signal margin between this case and the case where one of the word lines WL0–WL3 is selected is corrected.

Figure 8:
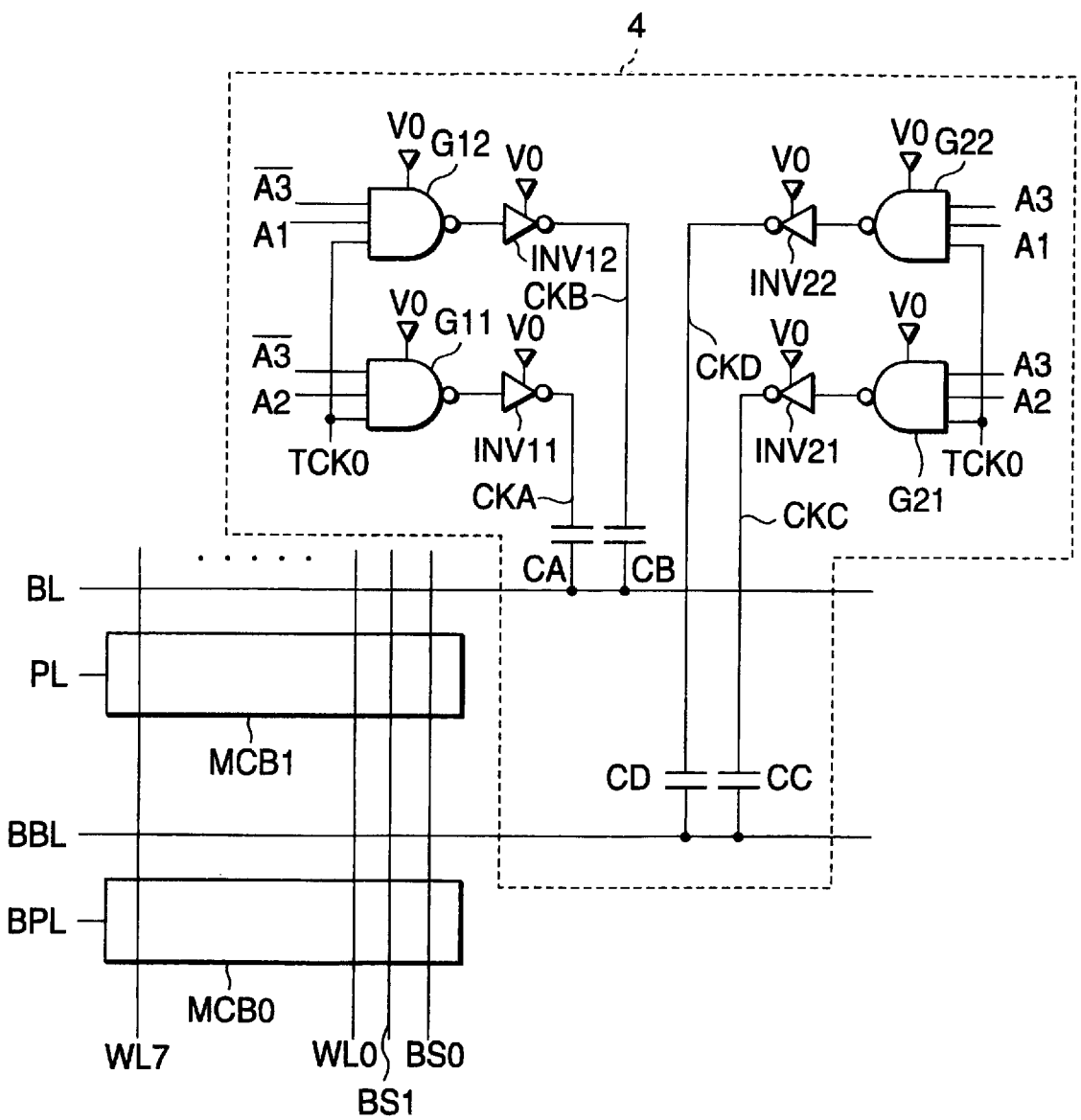
FIG. 8 is another example of circuit configuration specifically showing another offset voltage applying circuit.

In FIG. 6, only one level of offset voltage is generated by the offset voltage applying circuit 4. In contrast with this, FIG. 8 shows the configuration of an offset voltage applying circuit 4 that can generate two levels of offset voltages. In this case, each bit line BL or BBL has two capacitors CA and CB, or CC and CD, for capacitive coupling. NAND gates G11, G12, G21, and G22 and inverters INV11, INV12, INV21, and INV22 are provided to drive driving terminals CKA, CKB, CKC, and CKD of the capacitors CA, CB, CC, and CD.

Like the case shown in FIG. 6, one of the eight word lines WL0–WL7 is selected by the three bits A0–A2 of an address, and one of the bit lines BL and BBL (i.e., one of the cell blocks MCB1 and MCB0) is selected by an address bit A3. Further, two voltage applying circuits are provided to each bit line so that an offset voltage supplied to the selected bit line when the word line WL4 or WL5 is selected is different from an offset voltage supplied to the selected bit line when the word line WL6 or WL7 is selected.

That is, the cell block MCB1 and one of the word lines WL4–WL7 are selected when A2="1" and /A3="1". At this time, the NAND gate G11 is activated, thereby driving the capacitor CA. Moreover, among the word lines WL4–WL7, the word line WL6 or WL7 is selected when A1="1" and /A3="1". At this time, the NAND gate G12 is activated, thereby driving the capacitor CB. That is, when the word line WL4 or WL5 is selected, only the capacitor CA is driven, and when the word line WL6 or WL7 is selected, both capacitors CA and CB are simultaneously driven.

In this way, when the word line WL6 or WL7 is selected, a higher offset voltage is applied to the selected bit line BL as compared with the case where the word line WL4 or WL5 is selected. The same applies to the case where the cell block MCB0 is selected and data is read to the bit line BBL. In this case, when the word line WL4 or WL5 is selected, only the NAND gate G21 is activated to drive the capacitor CA, and when the word line WL6 or WL7 is selected, the NAND gate G22 is additionally activated to drive both capacitors CC and CD simultaneously.

Figure 9:
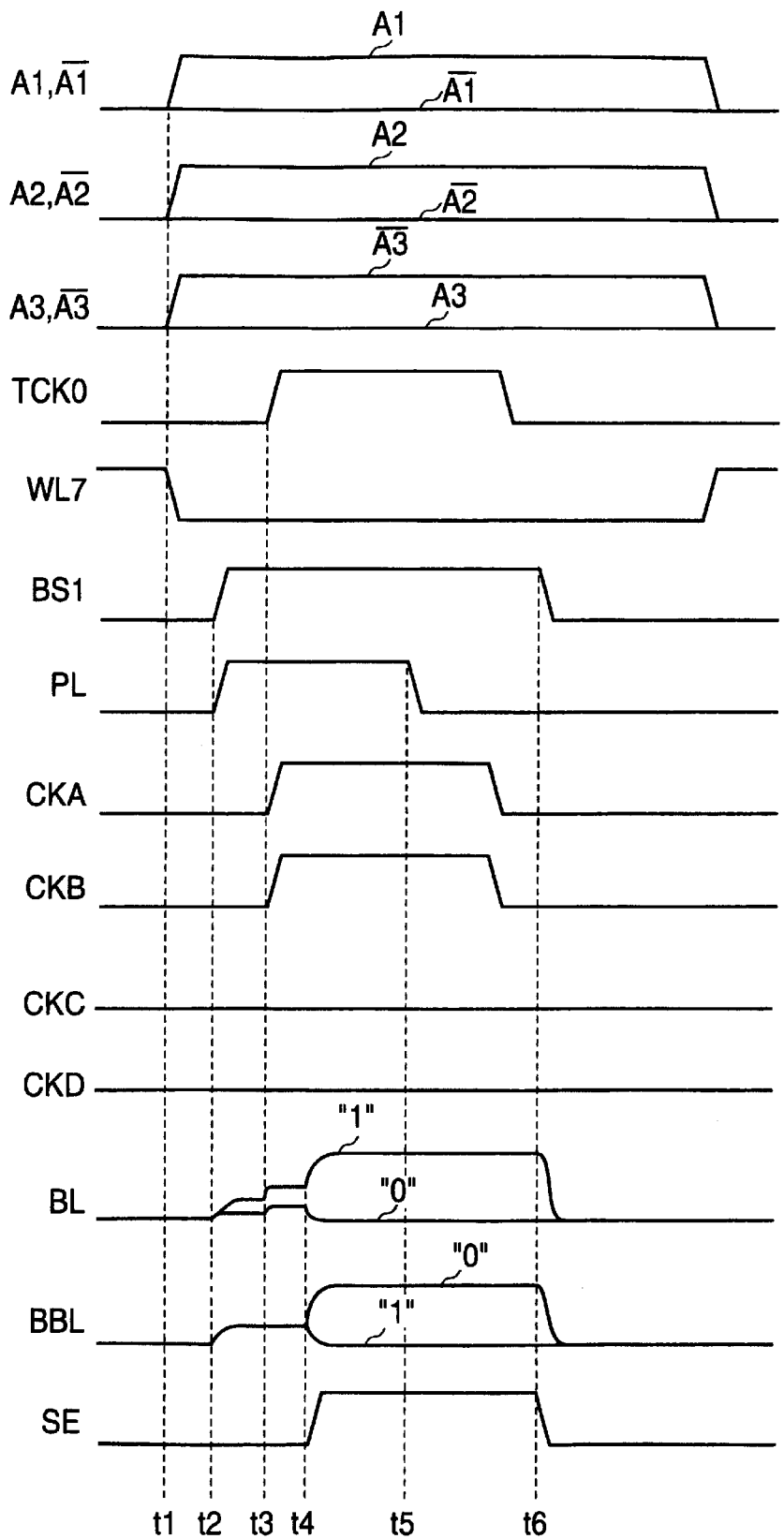
FIG. 9 is an operational timing chart of the case where the offset voltage applying circuit of FIG. 8 is used.

FIG. 9 is a timing chart of the operations of the ferroelectric memory device, representing the case where the cell block MCB1 is selected and the word line WL7 is selected by A1="1", A2="1", and /A3="1". The word line WL7 is selected (time t1), and then the block selecting signal BS1 for selecting the cell block MCB1 is set to be at "H" to set the plate line PL to be at "H" (time t2). When the activating signal TCK0 becomes "H", the two NAND gates G11 and G12 are activated, thereby outputting the driving signals CKA and CKB (time t3).

In this way, an offset voltage is supplied via the capacitors CA and CB to the bit line BL, to which data is read. After that, the sense amplifier is activated (time t4) to sense and amplify "0" data and "1" data. Then, the plate line PL is set to be at "L" (time t5). After the read data is rewritten, the sense amplifier is deactivated (time t6). The same operations are performed when the word line WL6 is selected. When the word line WL4 or WL5 is selected, only the driving signal CKA is set to be at "H" to drive only the capacitor CA.

In the offset voltage applying circuit 4 shown in FIGS. 6 and 8, the power supply voltage ΔV0 is used as the capacitor driving voltage. Therefore, in FIG. 8, in order to generate two levels of offset voltages, it is necessary to provide two capacitors CA and CB or CC and CD for each of the bit lines BL and BBL. If several capacitor driving voltages can be supplied, one capacitor may generate several different levels of offset voltages.

Figure 10:
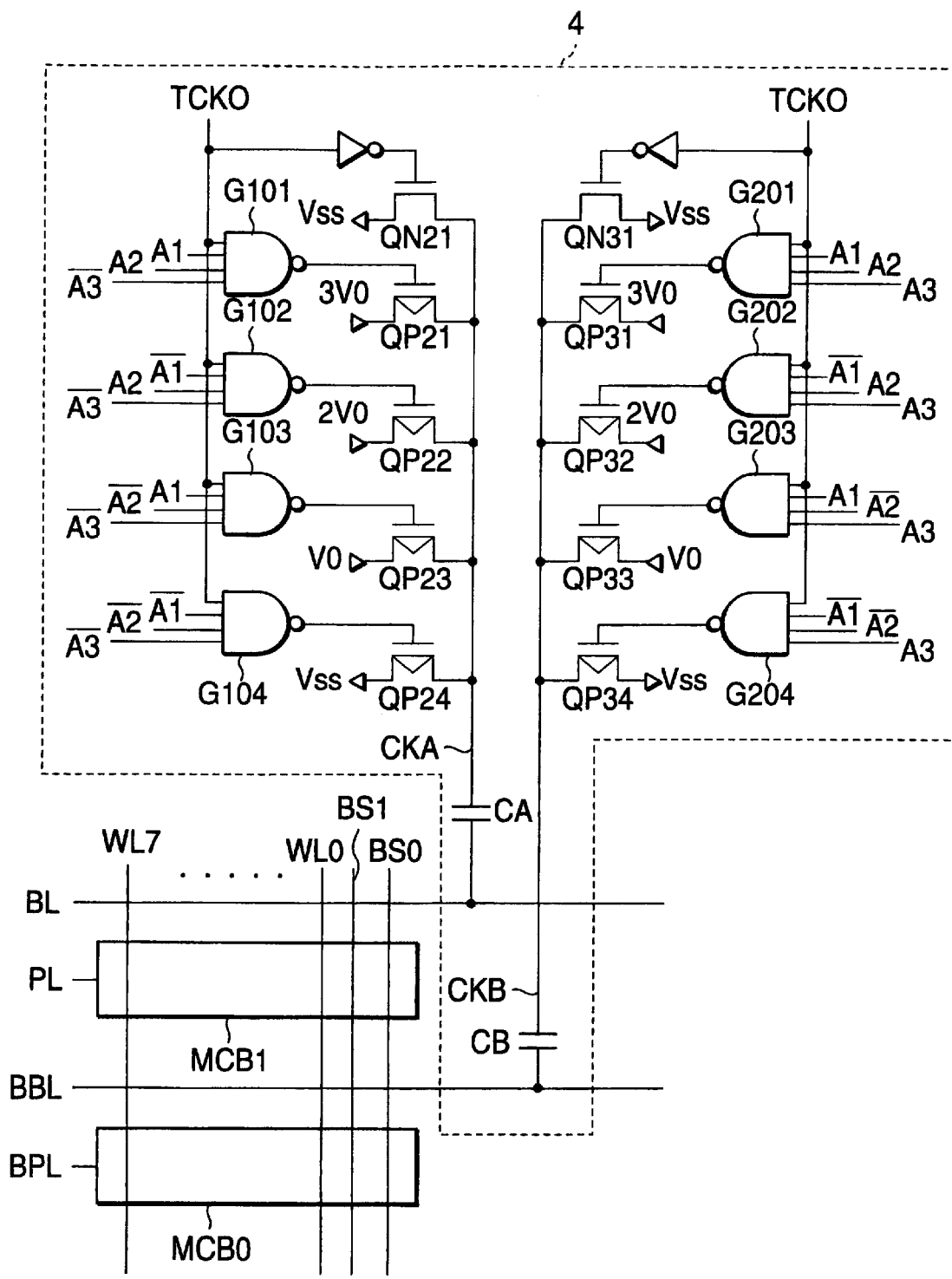
FIG. 10 is a further example of circuit configuration specifically showing a further offset voltage applying circuit.

FIG. 10 shows a configuration of such an offset voltage generating circuit 4. In this case, four levels of driving voltages VSS, V0, 2V0, and 3V0 are selectively supplied to driving terminals CKA and CKB of the coupling capacitors CA and CB connected to the bit lines BL and BBL so as to generate four levels of offset voltages. That is, different levels of offset voltages are supplied to the bit line in accordance with which word line is selected, i.e., WL0 or WL1, WL2 or WL3, WL4 or WL5, and WL6 or WL7 among the eight word lines WL0–WL7.

In order to accomplish this, a driving terminal CKA of the capacitor CA is connected with driving PMOS transistors QP21, QP22, QP23, and QP24 for supplying the voltages 3V0, 2V0, V0, and VSS. Similarly, a driving terminal CKB of the capacitor CB is provided with driving PMOS transistors QP31, QP32, QP33, and QP34 for supplying the voltages 3V0, 2V0, V0 and VSS. The driving terminals CKA and CKB are also connected with resetting NMOS transistors QN21 and QN31, respectively, which reset the driving terminals CKA and CKB to be VSS.

NAND gates G101, G102, G103, and G104 are also provided as decoding gates to selectively turn on the driving PMOS transistors QP21, QP22, QP23, and QP24 in accordance with an inputted address. Similarly, NAND gates G201, G202, G203, and G204 are also provided as decoding gates to selectively turn on the driving PMOS transistors QP31, QP32, QP33, and QP34 in accordance with an inputted address.

The NAND gates G101, G102, G103, and G104 are activated when the address bit A3 satisfies /A3="1", i.e., the cell block MCB1 is selected. The NAND gates G201, G202, G203, and G204 are activated when A3=1, i.e., the cell block MCB0 is selected. Further, combinations of A1, /A1, A2, and /A2 for selecting two from eight word lines are inputted to these NAND gates so that these NAND gates are turned on in accordance with the position of the word line.

Figure 11:
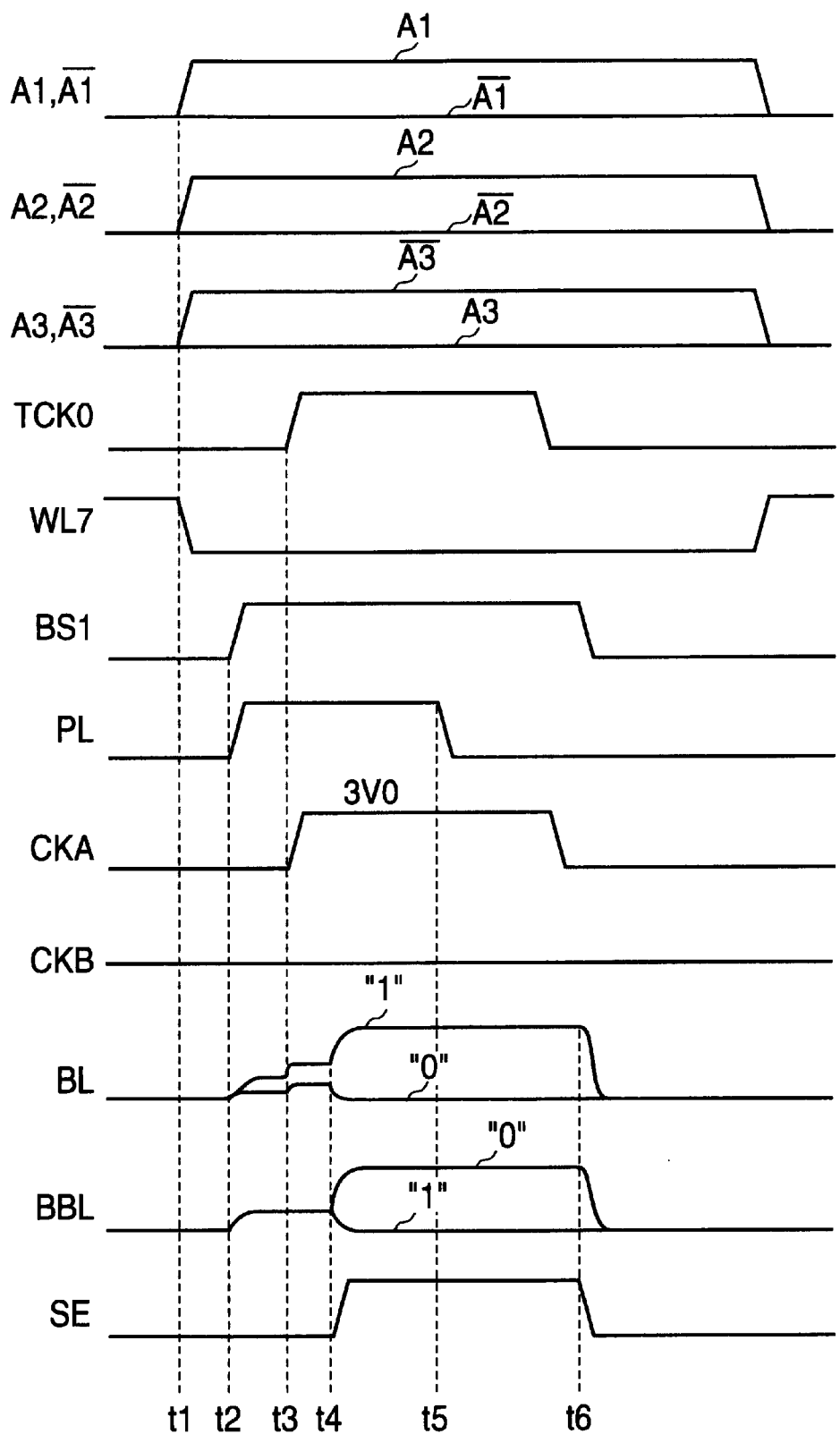
FIG. 11 is an operational timing chart of the case where the offset voltage applying circuit of FIG. 10 is used.

FIG. 11 is a timing chart of the operations of the ferroelectric memory device, representing the case where the cell block MCB1, i.e., the bit line BL, is selected by /A3="1", and the word line WL6 or WL7 is selected by A1=A2="1". For example, the word line WL7 is selected (time t1), and then the block selecting signal BS1 for selecting the cell block MCB1 is set to be at "H" to set the plate line PL to be at "H" (time t2). After that, when the activating signal TCK0 becomes "H", the NAND gate G101 is activated by A1=A2=/A3="1" to turn on the driving transistor QP21, thereby outputting 3V0 to the driving terminal CKA (time t3).

In this way, the capacitor CA driven by 3V0 supplies a higher offset voltage to the bit line BL, to which data is read. Then, the sense amplifier is activated (time t4) to sense and amplify "0" data and "1" data. After that, the plate line PL is set to be at "L" (time t5). After the read data is rewritten, the sense amplifier is deactivated (time t6). The same operations are performed when the word line WL6 is selected.

When the word line WL4 or WL5 is selected, the NAND gate G102 is turned on to turn on the driving transistor QP22, and 2V0 is supplied to the driving terminal CKA. Accordingly, the bit line BL is supplied with an offset voltage lower than the offset voltage in the case where the word line WL6 or WL7 is selected. When the word line WL2 or WL3 is selected, the NAND gate G103 is turned on to turn on the driving transistor QP23, and V0 is supplied to the driving terminal CKA. In this way, the bit line BL is supplied with an offset voltage still lower than the offset voltage in the case where the word line WL4 or WL5 is selected. Thus, the bit line is supplied with several levels of offset voltages in accordance with the position of the selected word line so as to compensate for the imbalance in signal margin.

In the above described embodiment, the timing of deactivating the offset voltage applying circuit 4, i.e., the timing of setting the activating signal TCK0 to be at "L", is fixed to be after the sense amplifier 2 performs a sensing operation and the plate line PL is returned to be at "L", and before the sense amplifier 2 is deactivated. However, the offset voltage applying circuit 4 may be turned off if the read data is confirmed. Therefore, the activating signal TCK0 may be set to be at "L" before the plate line PL becomes "L".

In the previously mentioned embodiment, the imbalance in read signal margin, which is caused by the position of the selected word line in the series connected TC type ferroelectric memory device, is compensated by applying a predetermined offset voltage to the bit line, to which data is read. Besides this way, it is possible to correct the imbalance in read signal margin by precharging inside nodes of the cell block from the plate line side of the cell block.

Such a way will be described as a second embodiment of the present invention.

(Second Embodiment)

Figure 12:
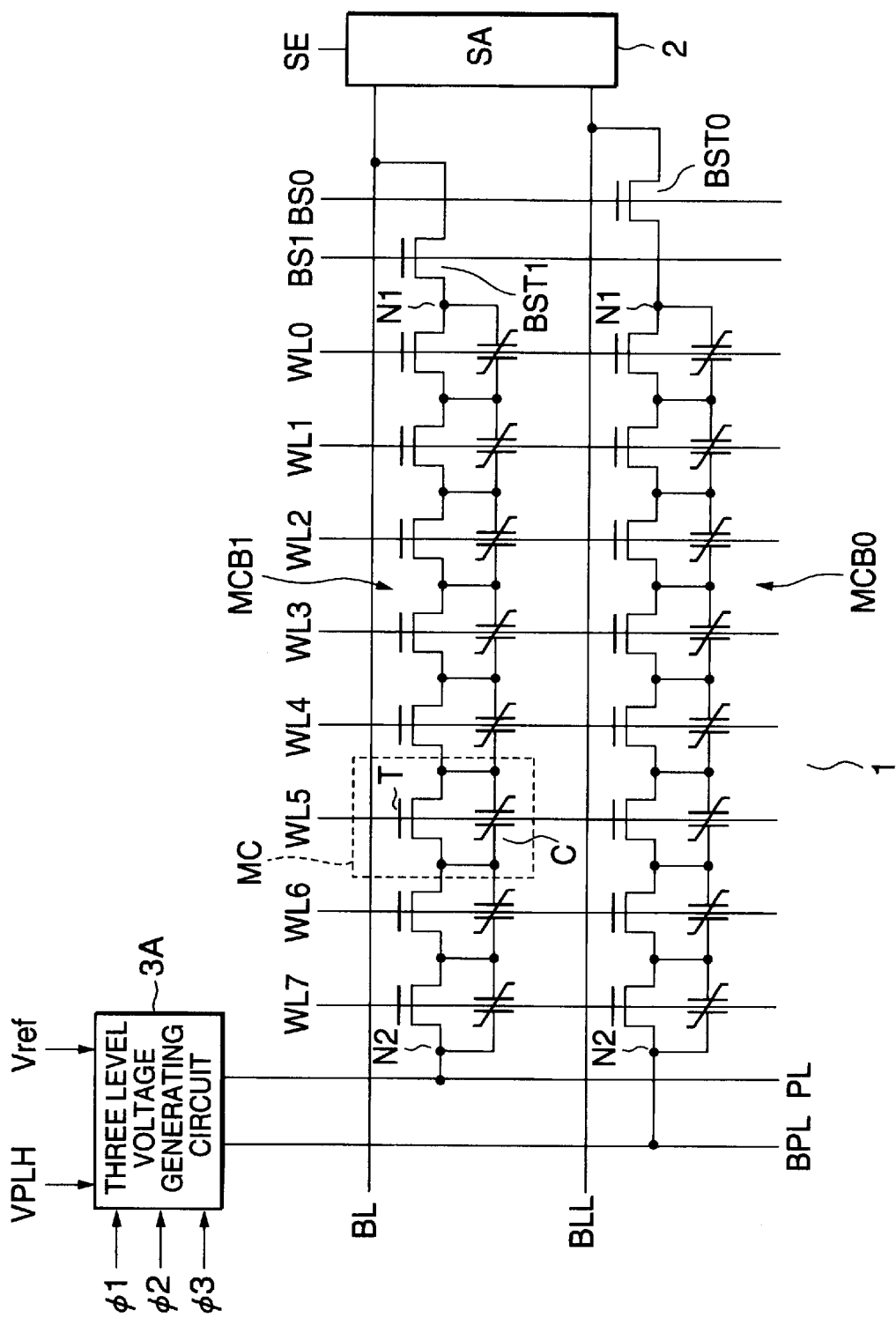
FIG. 12 is an equivalent circuit diagram showing a configuration of a second embodiment of a ferroelectric memory device according to the present invention.

FIG. 12 is an equivalent circuit diagram showing a configuration of the main part of a series connected TC unit type ferroelectric memory device (hereinafter referred to as "ferroelectric memory device") according to a second embodiment of the present invention. The ferroelectric memory device in this embodiment is achieved by replacing the plate line driving circuit (not shown) of the conventional ferroelectric memory device shown in FIG. 24 with a plate line driving circuit 3A. That is, the basic configuration of the ferroelectric memory device according to this embodiment is the same as that of the conventional ferroelectric memory device shown in FIG. 24. A unit cell MC includes a cell transistor T and a ferroelectric capacitor C, both ends of the ferroelectric capacitor C being connected with a source and a drain of the cell transistor T. In FIG. 12, eight of such unit cells MC are series-connected between terminals N1 and N2 to form a cell block MCB. Two cell blocks MCB0 and MCB1 connected to a pair of bit lines BL and BBL, respectively, are depicted in FIG. 12.

One end N1 of the cell block MCB0 is connected to the bit line BBL via a block selecting transistor BST0, and one end N1 of the cell block MCB1 is connected to the bit line BL via a block selecting transistor BST1. The other end N2 of the cell block MCB0 is connected to a plate line BPL and the other end N2 of the cell block MCB1 is connected to a plate line PL. Gates of cell transistors in each cell block are connected to word lines WL0 to WL7. A sense amplifier (SA) 2 for sensing and amplifying read data is connected to the bit lines BL and BBL, and the plate line driving circuit 3A is connected to the plate lines PL and BPL.

The plate line driving circuit 3A is formed as a three level voltage generating circuit which has a function as a precharge circuit for precharging inside nodes of the cell blocks MCB0 and MCB1 to be at a predetermined potential in a standby mode, besides the function as a general plate line driving circuit for driving the plate lines PL and BPL in an active mode. The precharge potential is set to be somewhere between the potential read to the bit line when the read data is "0" data and the potential when the read data is "1" (preferably, the intermediate potential like the reference potential). In an active mode, the plate line driving circuit 3A sequentially outputs to the plate line a potential higher than the above-described precharge potential and a potential lower than the precharge potential.

Figure 14:
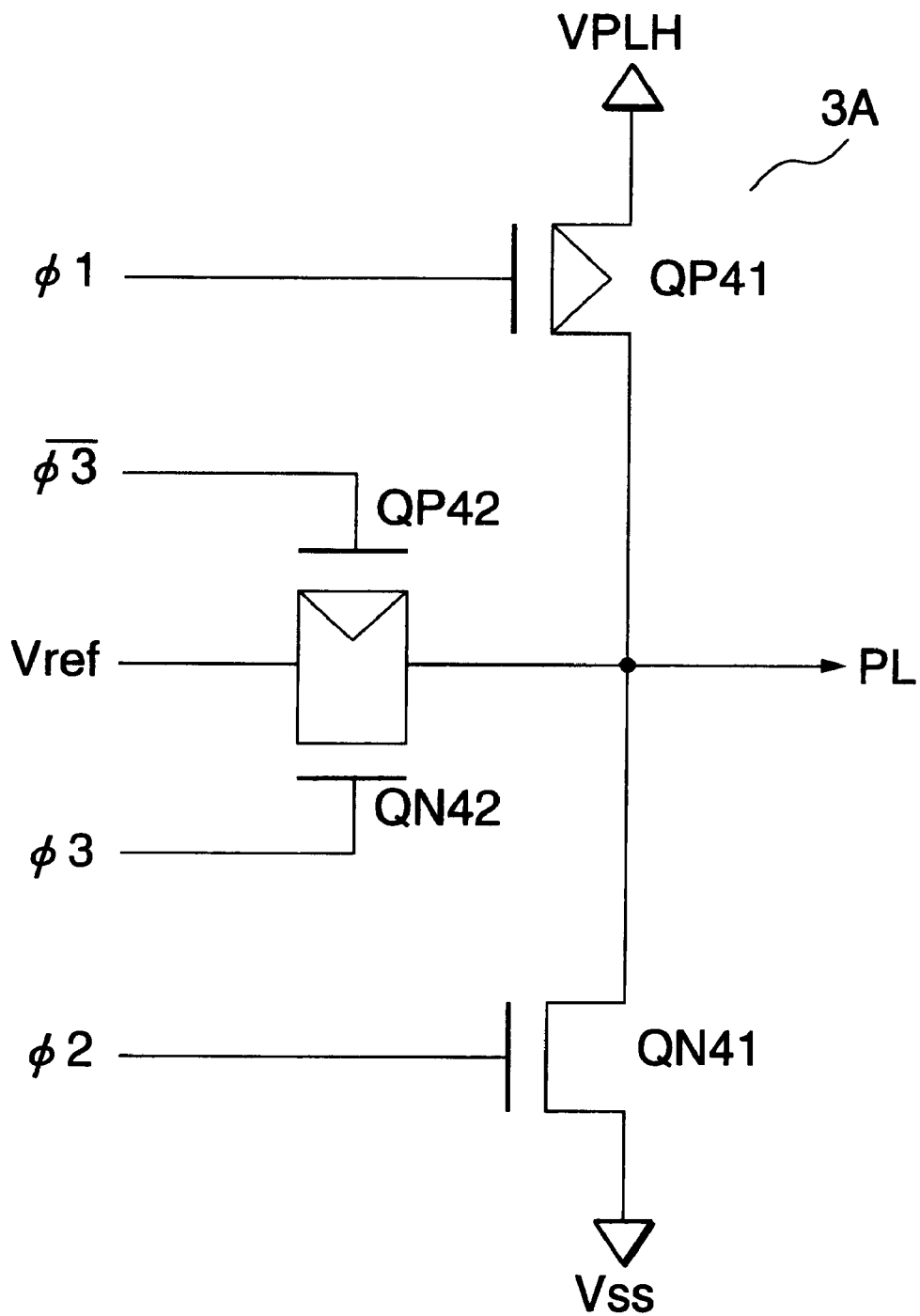
FIG. 14 shows a configuration of a plate line driving circuit of a ferroelectric memory device according to the second embodiment of the present invention.

FIG. 14 specifically shows the configuration of a section in the plate driving circuit 3A for driving one plate line PL. A PMOS transistor QP41 is turned on by a clock φ1="L" to apply a high potential VPLH to the plate line PL. An NMOS transistor QN41 is turned on by a clock φ2="H" to apply a low potential VSS to the plate line PL. An NMOS transistor QN42 and a PMOS transistor QP42 are turned on by a clock φ3="H" and /φ3="L", respectively, to apply a precharge potential (in the case of FIG. 14, the reference voltage Vref) to the plate line PL.

Figure 15:
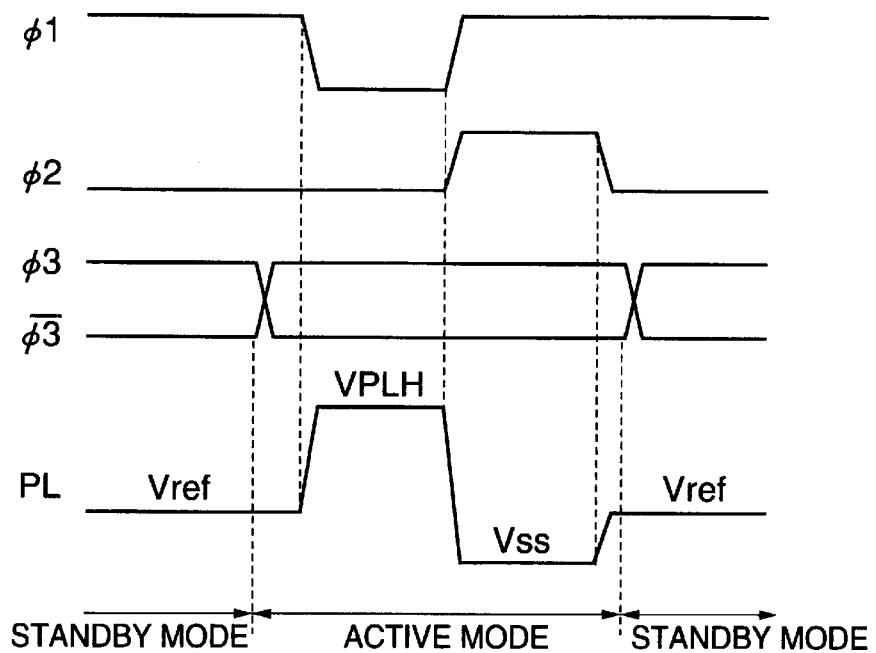
FIG. 15 shows operational waveforms of the plate line driving circuit according to the second embodiment of the present invention.

The operational waveforms in the plate line driving circuit 3A are shown in FIG. 15. In a standby mode, φ1="H", φ2="L", and φ3="H". At this time, the plate line PL is supplied with the precharge potential Vref, which is transferred to the internal nodes of the cell block, as described later. In an active mode, the high potential VPLH and the low potential VSS are sequentially applied to the plate line PL as φ3="L", φ1 changes from "H" to "L", and then φ2 changes from "L" to "H".

Figure 13:
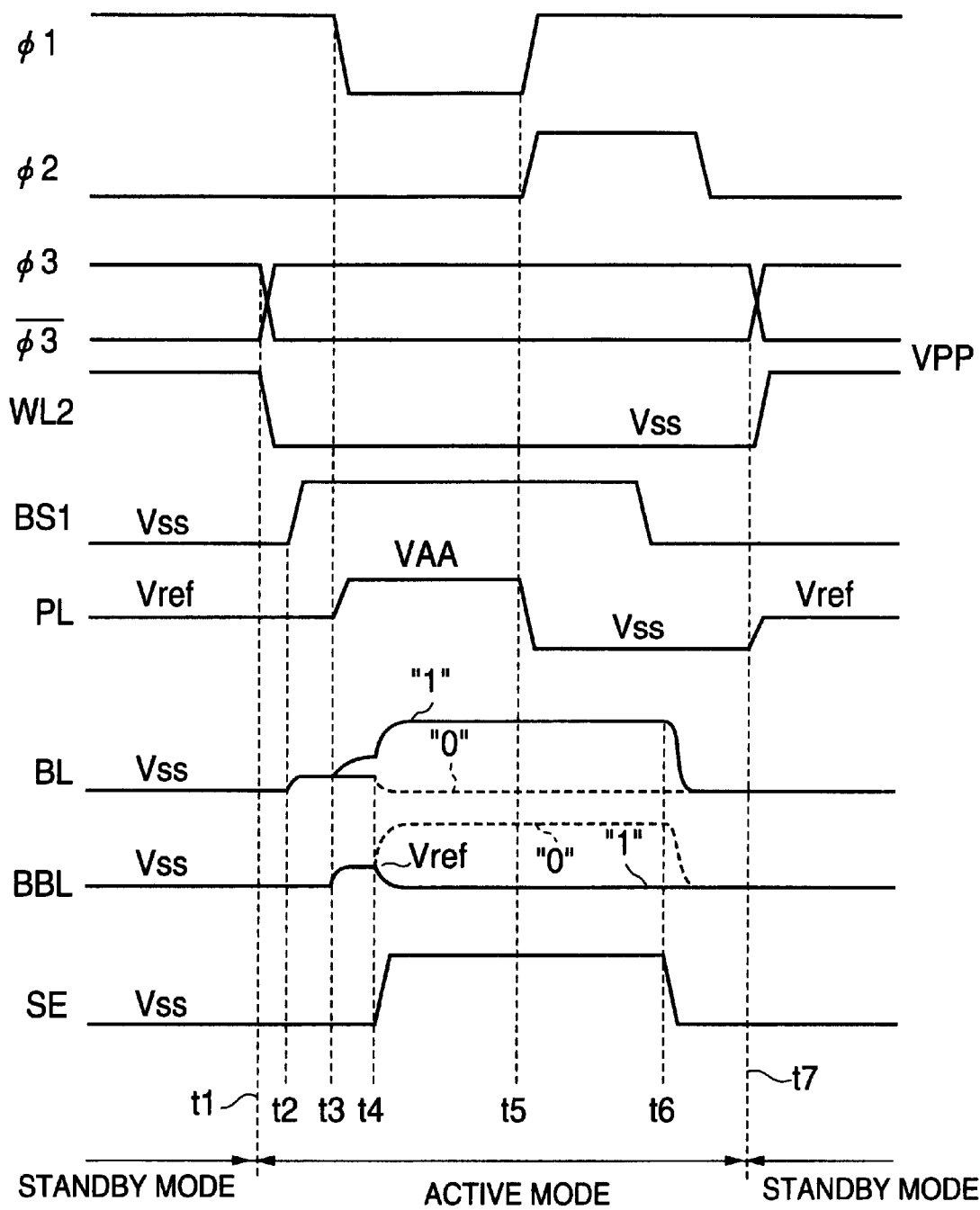
FIG. 13 is a timing chart of the operations of a ferroelectric memory device according to the second embodiment of the present invention.

The operations of the ferroelectric memory device shown in FIG. 12, regarding the cell block MCB1 and in the case where the word line WL2 is selected in an active mode, will be described hereinafter with reference to the timing chart of FIG. 13. As mentioned previously, in a standby mode, φ3="H" and the precharge potential Vref is supplied from the plate line driving circuit 3A to the plate line PL. While such an operation is performed, the potential of all the word lines WL0 to WL7 is at VPP (>VAA). The precharge potential Vref is transferred to the internal node of the cell block MCB1 via the transistor that is turned on. In a conventional way of precharging a plate line PL to be at VSS, there is a problem that a high voltage in a range of VPP to VSS is applied to a gate oxide film of a cell transistor, thereby deteriorating the reliability. In contrast with this, in the present invention, in which the plate line PL is precharged to be at Vref, the voltage applied to a gate oxide film of a cell transistor can be lowered in a range of VPP to Vref. Accordingly, the problem of the reliability can be eased.

The clock φ3 is set to be at "L", and at the same time, the selected word line WL2 is set to be at "L", thereby entering an active operation (time t1). The block selecting signal BS1 is selected to become "H" (time t2), and the ferroelectric capacitor of the selected memory cell in the cell block MCB1 is connected to the bit line BL. After that, the clock φ1 is set to be at "L" to supply a high potential VPLH (in the case of FIG. 13, the power supply potential VAA) to the plate line PL (time t3), thereby reading data to the bit line. Then, the sense amplifier activating signal SE is set to be at "H", and based on the result of the comparison between the reference potential Vref supplied to the bit line BBL and the potential of the bit line BL, the voltage supplied to the bit line BL is amplified to be VSS or VAA depending on whether the data is "0" data or "1" data (time t4).

Then, the potential of the plate line PL is returned to be the low potential VSS when the clock φ1 becomes "H" and the clock φ2 also becomes "H" (time t5). The sense amplifier 2 is still kept active. Then, as mentioned previously, a reversal voltage is applied to the ferroelectric capacitor when "1" data is inputted, and no voltage is applied when "0" data is inputted to perform a rewriting operation. Next, the block selecting signal BS1 is set to be at "L" to disconnect the cell block from the bit line BL, and the sense amplifier 2 is deactivated (time t6). Then, the memory device returns to a standby mode by setting the clock φ2 to be at "L", the word line WL2 to be at "H", and the clock φ3 to be at "L".

Figure 16:
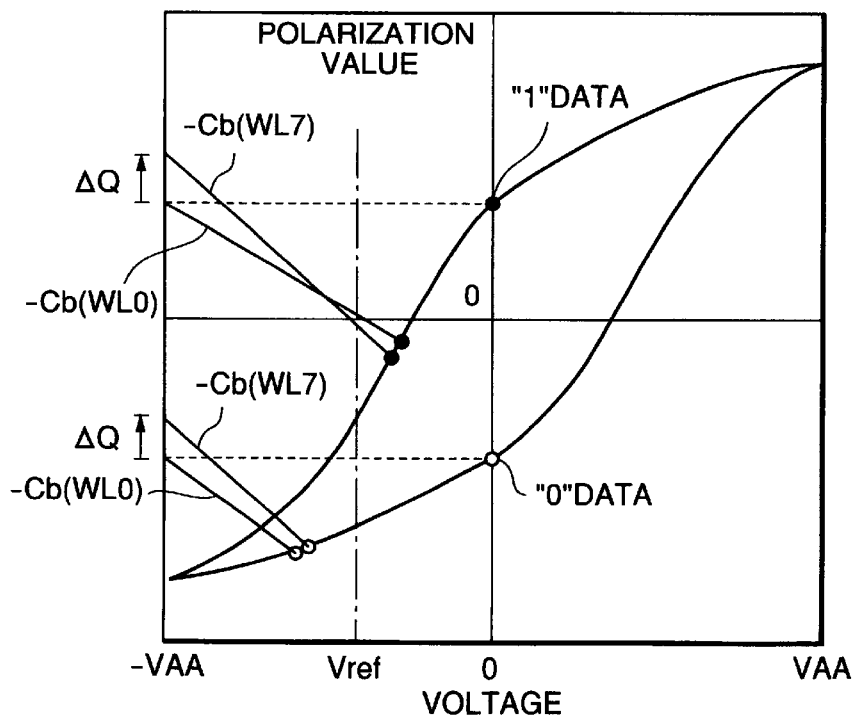
FIG. 16 is a voltage locus chart of the read signal of the ferroelectric memory device according to the second embodiment of the present invention.
Figure 27:
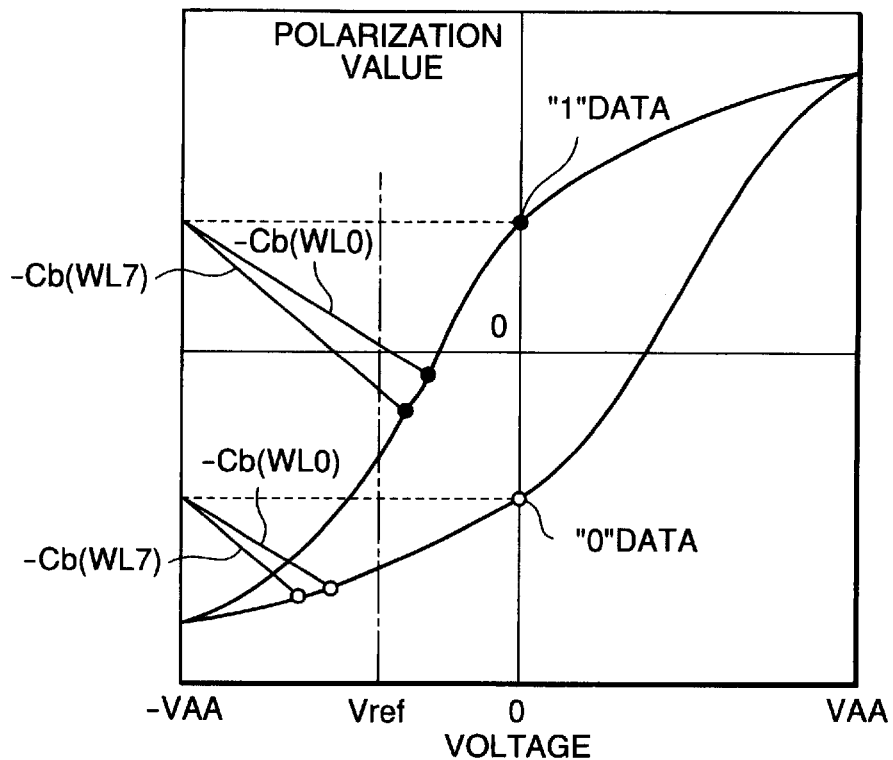
FIG. 27 shows changes in read signal potential in accordance with the positions of the word lines of the series connected TC unit type ferroelectric memory device.

FIG. 16 shows the locus of the voltage applied to the ferroelectric capacitor in this embodiment in the same manner as FIG. 27, which shows the locus of the voltage applied to the conventional ferroelectric memory device. In this embodiment, the internal nodes of the cell block are precharged to be at Vref. Therefore, when data is read, the electric charge accumulated in the nodes of the memory cells at the bit line side relative to the selected memory cell is added to the signal charge and read to the bit line. The amount of electric charge added to the signal charge is the lowest in the case where the memory cell that is the closest to the bit line is selected by the word line WL0, and is the highest in the case where the memory cell that is the most distant from the bit line is selected by the word line WL7.

An assumption is made that as a result of precharging the internal nodes of the cell block, when the word line WL7 is selected, the amount of signal charge increases by ΔQ as compared to the case where the word line WL0 is selected. This is equivalent to the case where the start point of the load line −Cb shifts by ΔQ between the case where the word line WL0 is selected and the case where the word line WL7 is selected, as shown in FIG. 16.

Thus, as shown in FIG. 16, although the bit line read potential of the "1" data is lower in the case of selecting the word line WL0 than that in the case of selecting the word line WL7, the difference is rather slim, as compared to the case of conventional ferroelectric memory device shown in FIG. 27. With respect to the "0" data, the bit line read potential is slightly higher in the case of selecting the word line WL7 than in the case of selecting the word line WL0.

Figure 17:
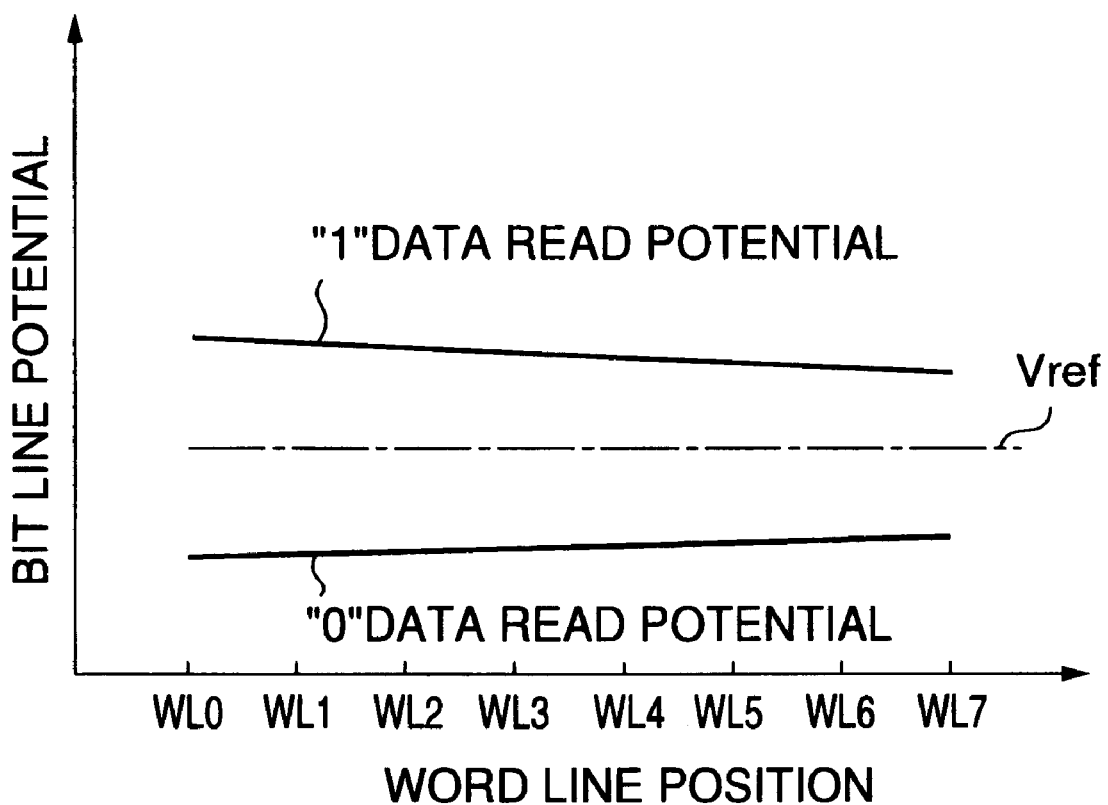
FIG. 17 shows the word line position dependency of the bit line read potential of the ferroelectric memory device according to the second embodiment of the present invention.
Figure 28:
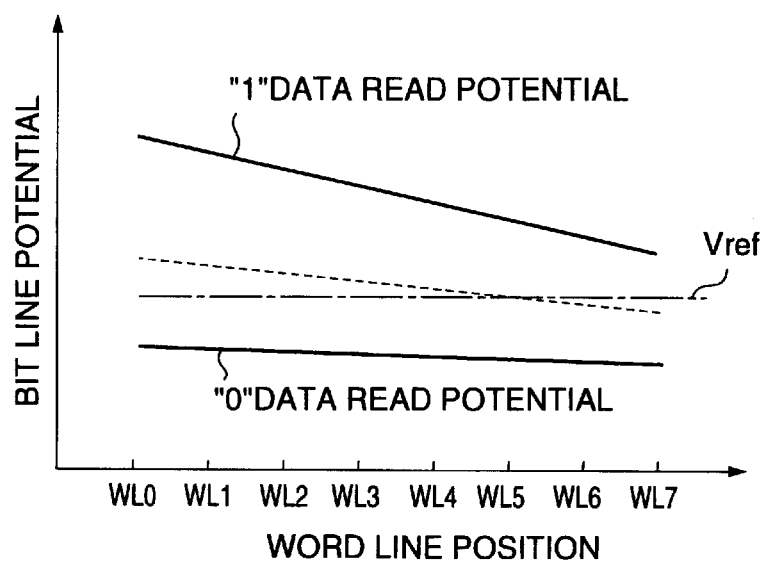
FIG. 28 shows the word line position dependency of the read signal potential of the series connected TC unit type ferroelectric memory device.

FIG. 17 shows the word line position dependency of the bit line read potential of this embodiment in the same manner as FIG. 28 showing the word line position dependency in the conventional ferroelectric memory device. In the case of the "0" data, although the bit line read potential slightly increases as the position of the word line changes from WL0 to WL7, it can be said that it is maintained substantially constant. On the contrary, in the case of the "1" data, although the bit line read potential slightly decreases as the position of the word line changes from WL0 to WL7, it can be said that it is maintained to be substantially constant. Therefore, by fixing the reference potential Vref (which is at the same time the precharge potential) to be substantially equal to the intermediate potential between the bit line read potential of the "0" data and the bit line read potential of the "1" data, the imbalance in signal margin caused by the position of the word line is automatically compensated. Regardless of which word line is selected, a substantially constant signal value can be achieved.

In a method of applying an offset voltage to a bit line, it is necessary to select an offset voltage in accordance with the position of the word line, resulting in the necessity of an address selecting function. In contrast with this, in this embodiment, among the electric charge precharged in the internal nodes of the cell block, only the electric charge accumulated in the internal nodes at the bit line side relative to the position of the selected word line is automatically added to the signal charge to be read. Therefore, it is not necessary to additionally provide a circuit having an address selecting function, thereby simplifying the circuit configuration.

Figure 18:
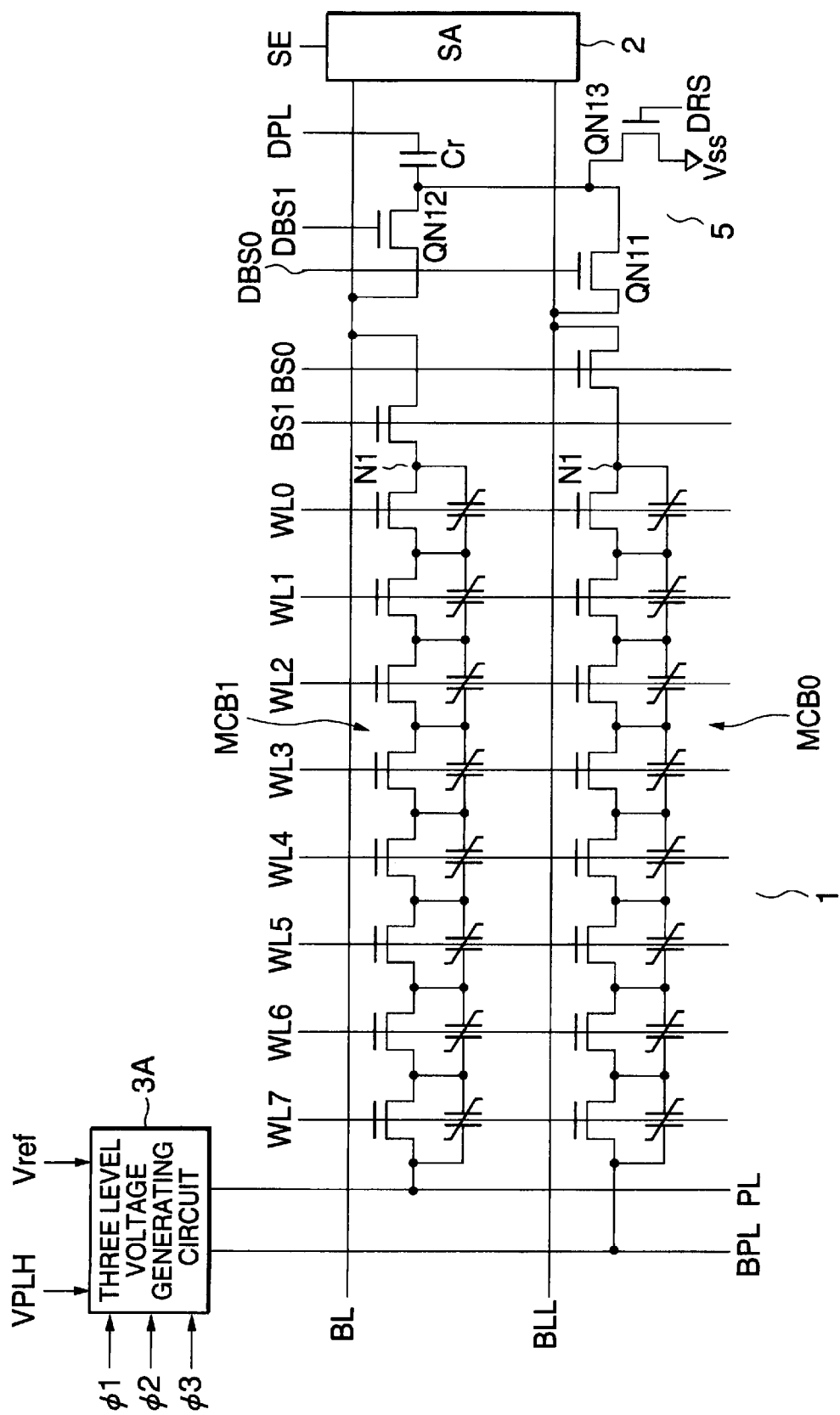
FIG. 18 shows a circuit configuration obtained by adding a reference potential generating circuit to the circuit configuration shown in FIG. 12.

FIG. 18 shows a circuit configuration obtained by adding a reference potential generating circuit to the circuit shown in FIG. 12. A reference potential generating circuit 5 includes a capacitor Cr, one end of which is connected to a driving line DPL. The other end of the capacitor Cr is connected to VSS via a resetting NMOS transistor QN13 in a standby mode, and selectively connected to the bit lines BBL and BL via NMOS transistors QN11 and QN12 in an active mode.

Figure 19:
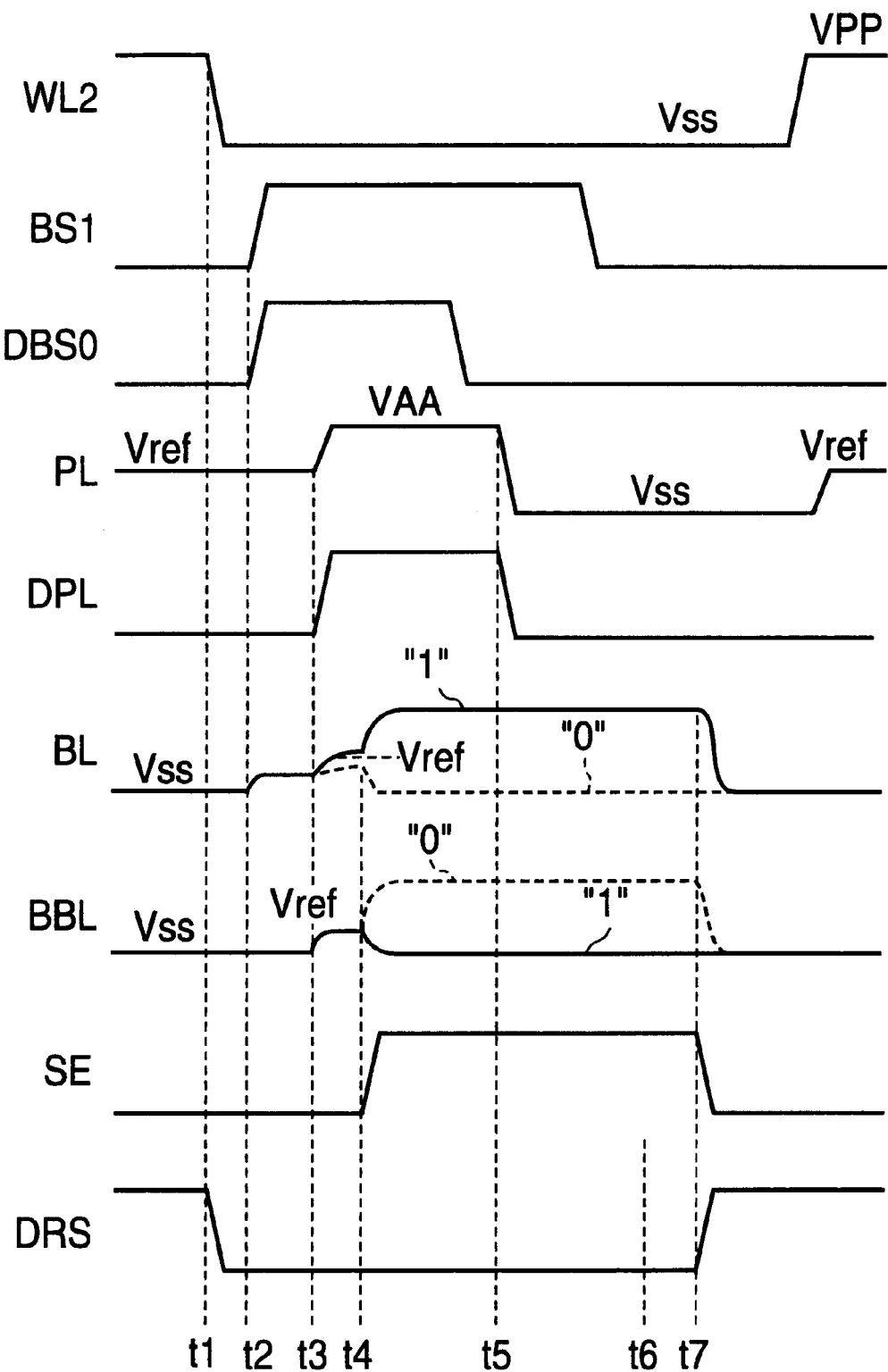
FIG. 19 is an operational timing chart of the circuit shown in FIG. 18.

FIG. 19 shows operational timings of the circuit shown in FIG. 18. Since the basic operations of this circuit are the same as those of the circuit shown in FIG. 12, the descriptions will be made with respect to the reference potential generating operation. The word line WL2 is set to be at "L" to enter an active operation (time t1). Then, the block selecting signal BS1 becomes "H", and at the same time the selecting signal DBS0 of the reference potential generating circuit 5 becomes "H" (time t2). Subsequently, the plate line PL is supplied with VAA, and at the same time the driving line DPL is set to be at "H" (time t3). As a result, the capacitor Cr is connected with the bit line BBL via the transistor QN11, the voltage supplied to the driving line DPL is capacitive-coupled to the bit line BBL at the reference side by a predetermined coupling ratio, and the reference potential Vref is applied to the bit line BBL (time t3). Then, the sense amplifier is activated (time t4) to sense and amplify "0" data and "1" data. Subsequently, after the selecting signal DBS0 is set to be at "L", the plate line PL and the driving line DPL are set to be at "L" (time t5). After the rewriting operation is completed, the resetting signal DRS is set to be at "H" to reset the node of the capacitor Cr to be at VSS (time t6), and the sense amplifier 2 is deactivated (time t7).

Thus, it is possible to compensate for the imbalance in read signal value caused by the position of the selected word line by means of a simple reference voltage generating circuit 5 using a single capacitor Cr to fix the reference potential Vref applied to the reference bit line side, and by means of the cell block precharging operation.

Figure 20:
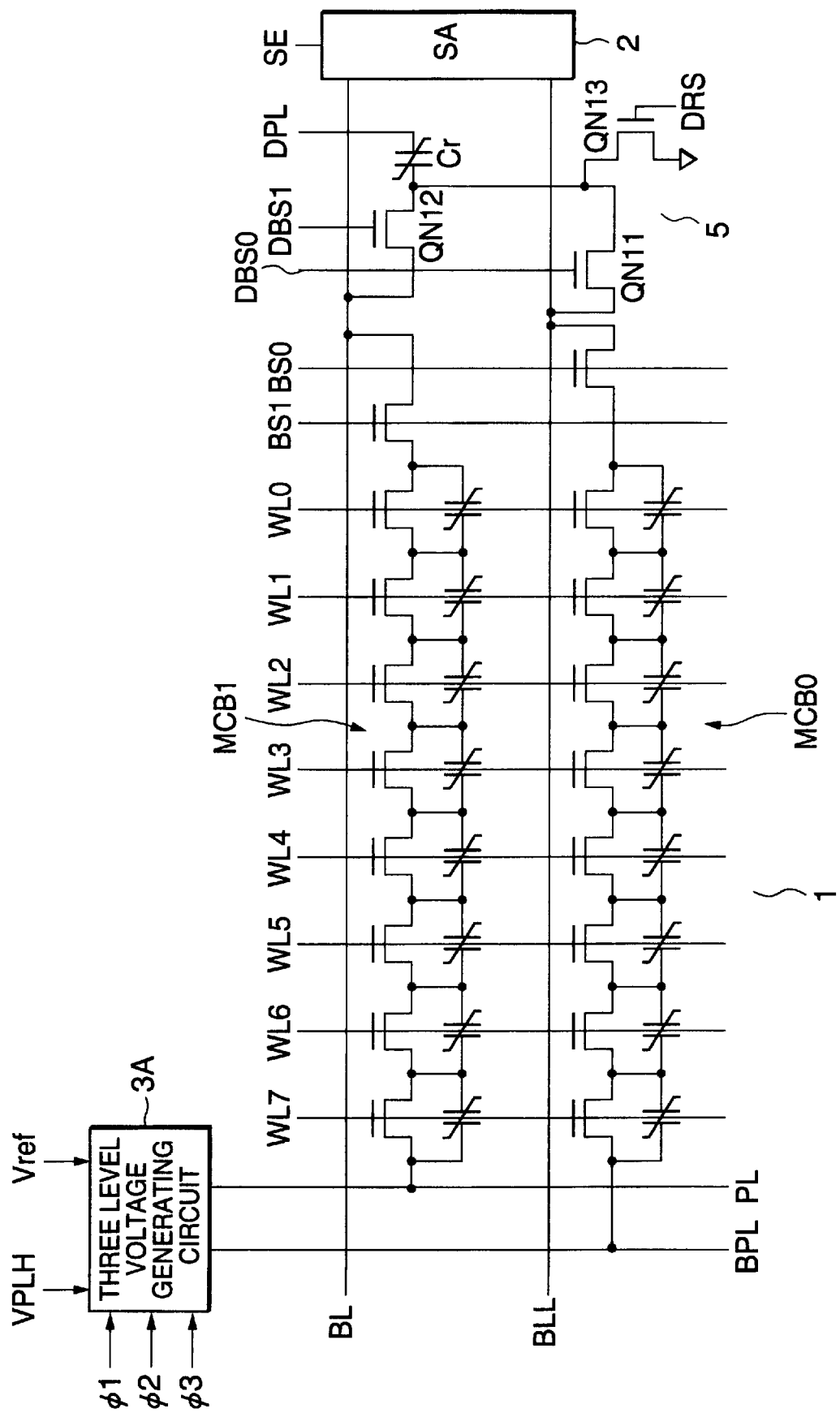
FIG. 20 shows a circuit configuration in which the reference voltage generating circuit of FIG. 18 is modified.

FIG. 20 shows an example in which a ferroelectric capacitor similar to that included in a memory cell is used, instead of a dielectric capacitor, as the capacitor Cr of the reference potential generating circuit 5 in FIG. 18. Except for the capacitor Cr, the configuration of FIG. 20 is the same as that of FIG. 18. In this case, a remanent polarization state equivalent to the "0" data state of the memory cell is written to the capacitor Cr. However, in order to obtain the intermediate value between the read potential of the "0" data and the read potential of the "1" data as the reference potential Vref by driving the driving line DPL by the same voltage level as the voltage level supplied to the plate line PL, for example, the area of the capacitor Cr should be larger than the area of the ferroelectric capacitor C of the cell unit MC.

Figure 21:
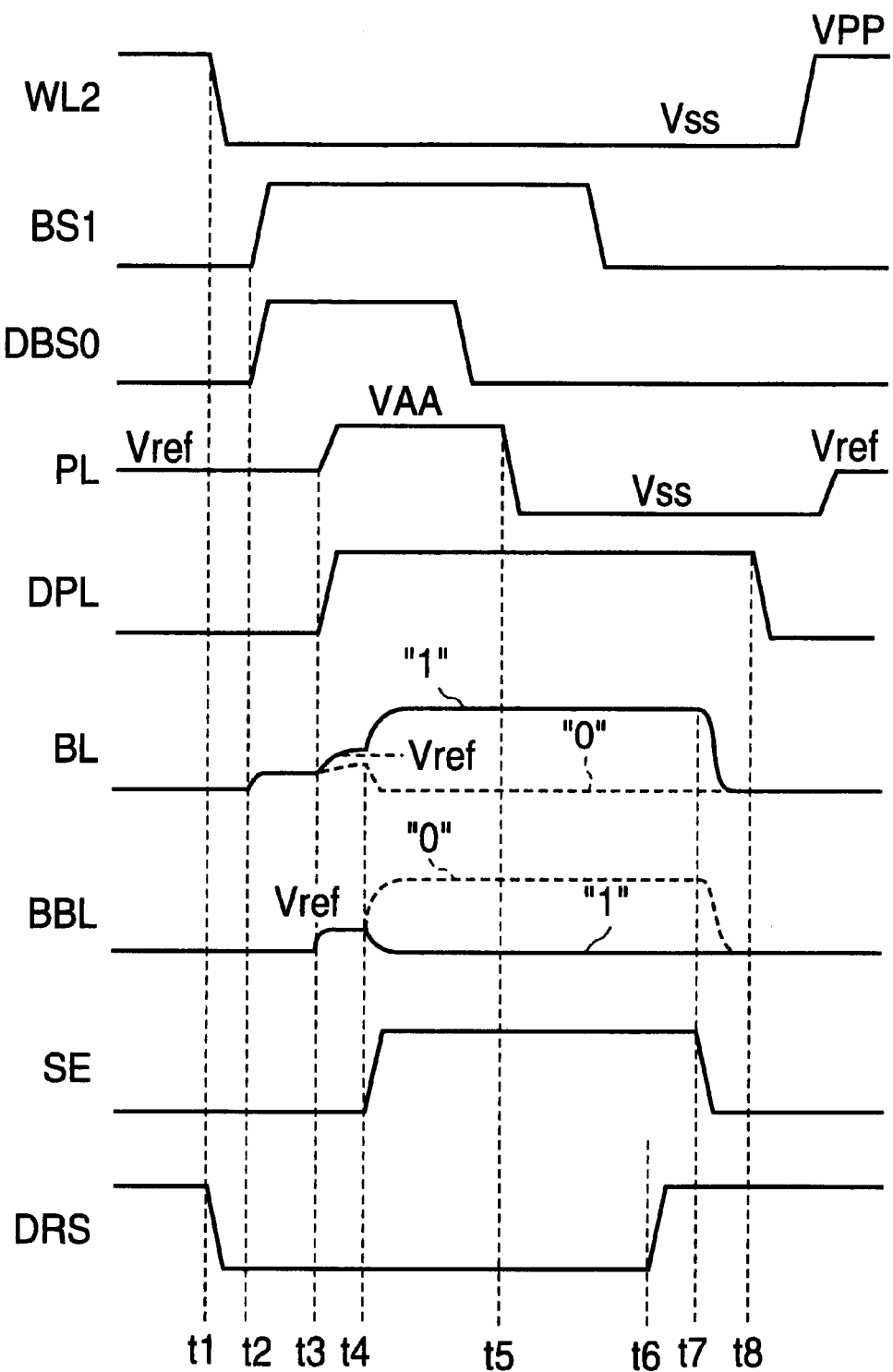
FIG. 21 is an operational timing chart of the circuit shown in FIG. 20.

FIG. 21 shows operational timings of the circuit shown in FIG. 20 in the same manner as FIG. 19. The difference between FIG. 21 and FIG. 19 lies in that the driving line DPL of the reference potential generating circuit 5 is maintained to be at "H" during a data reading operation, and that after a sensing operation is completed, the driving DPL is set to be at "L" at time t8. Because of this process, it is possible to prevent "1" data from being accidentally written due to the ferroelectric capacitor used as the capacitor Cr.

In the above describe embodiments, predetermined compensation voltages have been applied to the bit line side, or the plate line side, which is placed opposite to the bit line, so as to compensate for the variations in read signal values caused by the variations in load of the ferroelectric capacitor in the cell unit which is selected in accordance with the position of the selected word line. However, it is possible to compensate for the imbalance in signal value, without applying a voltage, by balancing the parasitic capacitance of the pair of bit lines. This method will be described as a third embodiment of the present invention.

(Third Embodiment)

Figure 22:
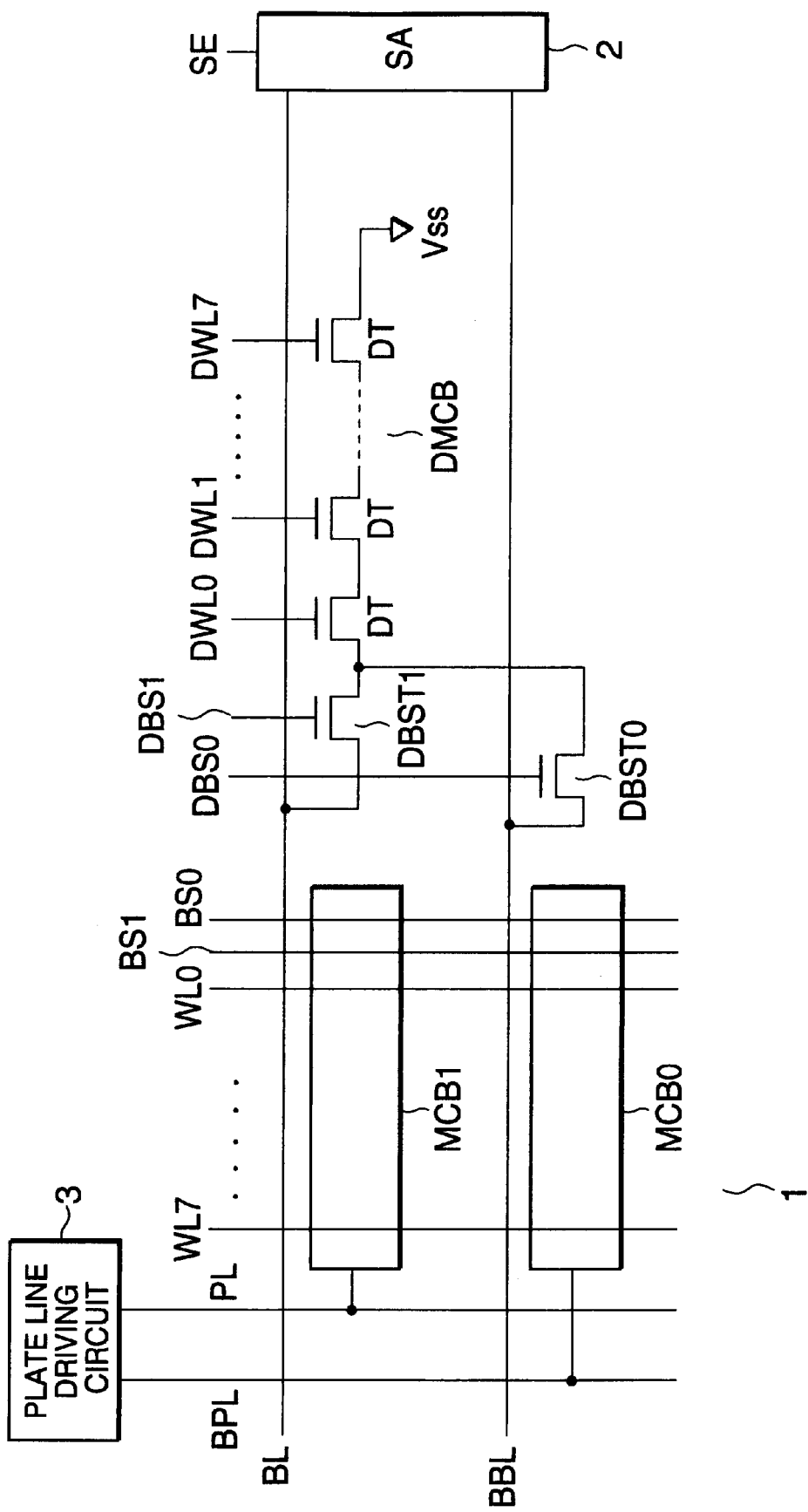
FIG. 22 is an equivalent circuit diagram showing a configuration of a third embodiment of a ferroelectric memory device according to the present invention.

FIG. 22 is an equivalent circuit diagram showing a configuration of the main part of a series connected TC unity type ferroelectric memory device according to a third embodiment of the present invention. The basic configuration of this circuit is the same as that of the circuit shown in FIG. 24. In this embodiment, besides cell blocks MCB1 and MCB0 provided for a pair of bit lines BL and BBL, a dummy cell block DMCB is provided. When the cell block MCB1 or MCB0 includes eight pairs of cell transistors T and ferroelectric capacitor C, a dummy cell block DMCB includes series-connected eight dummy transistors DT.

One end of the dummy cell block DMCB is grounded. The other end is selectively connected to the bit lines BBL and BL via dummy block selecting transistors DBST0 and DBST1. Gates of the dummy cell transistors DT are driven by dummy word lines DWL0 to DWL7. The dummy block selecting transistors DBST0 and DBST1 are driven by block selecting signals DBS0 and DBS1. Besides the dummy cell block DMCB, a reference potential generating circuit 5 similar to the one shown in FIG. 18 or FIG. 20 is provided to apply a reference voltage Vref to the bit lines BL and BBL.

When either of the cell blocks MCB0 and MCB1 is selected, the dummy cell block DMCB adds a parasitic capacitance to the reference side bit line, which parasitic capacitance is equivalent to the parasitic capacitance determined by the position of the selected unit cell. Since the ferroelectric capacitors of the unit cells placed at the bit line side relative to the selected unit cell are shunted, the parasitic capacitance of the selected cell block is substantially determined by gate capacitance and diffusion layer capacitance of the cell transistors placed at the bit line side relative to the selected unit cell. Accordingly, if the size of the dummy cell transistor DT is assumed to be the same as that of the cell transistor T used in the cell block, it is possible to add a parasitic capacitance to the reference bit line, which parasitic capacitance is equivalent to the parasitic capacitance added to the selected bit line, by selecting a dummy word line corresponding to the word line.

Figure 23:
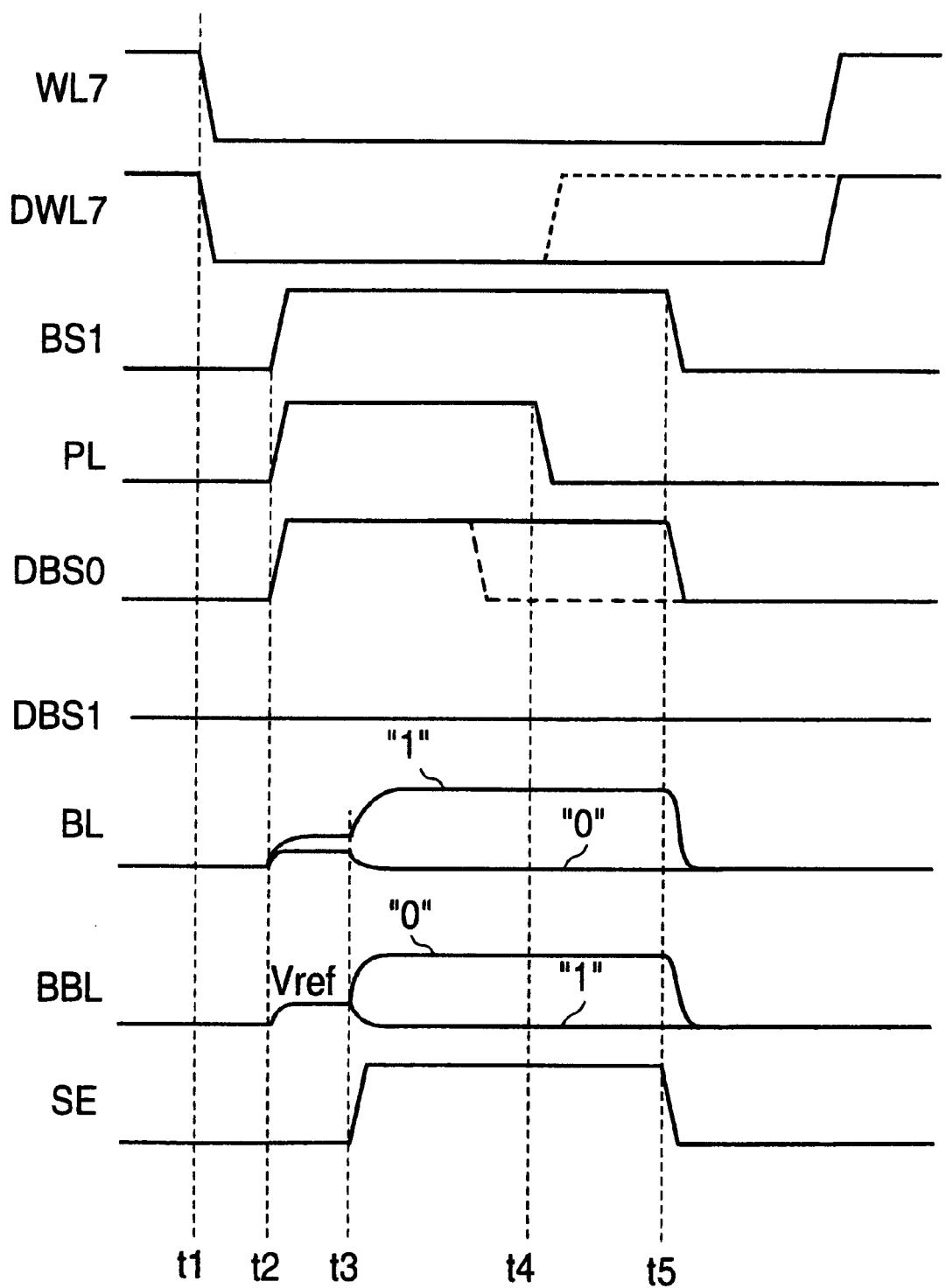
FIG. 23 is a timing chart of the operations of the ferroelectric memory device according to the third embodiment of the present invention.

FIG. 23 is a timing chart showing the operations of this embodiment. In a standby mode, while the word lines WL0 to WL7 are held to be at "H", the dummy word lines DWL0 to DWL7 are also held to be at "H". In an active mode, when one of the word lines WL0 to WL7 is set to be at "L", one of the dummy word lines DWL0 to DWL7 corresponding to the selected word line is also set to be at "L". FIG. 23 shows the case where the cell block MCB1 is selected and the word line WL7 is selected. At the same time as the word line WL7 is selected, the dummy word line WL7, which corresponds to the word line WL7, is selected (time t1). At the same time as the block selecting signal BS1 is set to be at "H" to select the cell block MCB1, the block selecting signal DBS0 is set to be at "H" to connect the dummy cell block DMCB to the bit line BBL (time t2).

In this way, the unit cell of the cell block MCB1 selected by the word line WL7 is connected to the bit line BL, and at the same time, the dummy cell transistor of the dummy cell block DMCB selected by the dummy word line DWL7 is connected to the reference side bit line BBL. A reference potential Vref is supplied to the reference side bit line BBL from the reference potential generating circuit 5 shown in FIG. 22. By activating a sense amplifier, it is determined whether the data is "0" data or "1" data (time t3). Then, as in the cases of the above-described embodiments, the plate line PL is set to be at "L" to rewrite the read data (time t4), and the sense amplifier 2 is deactivated (time t5).

In this embodiment, in the operation to read the cell block MCB, when a parasitic capacitance, which may vary depending on the position of the selected word line, of the cell block is connected to the bit line BL, a parasitic capacitance, which may also vary depending on the position of the selected word line, is also connected to the reference side bit line BBL by the dummy cell block DMCB. In other words, this means that the reference potential Vref applied to the reference side bit line is substantially changed in accordance with the position of the selected word line in the cell block. As a result, the imbalance in signal value depending on the position of the selected word line is compensated.

In this embodiment, a dummy cell block only includes cell transistors, and it is not required to perform rewriting operation, etc. Accordingly, as shown by a broken line in FIG. 23, after the sense amplifier 2 is activated to confirm the data, the selected block selecting signal DBS0 may be set to be at "L", or the selected dummy word line DWL7 may be set to be at "L".

Figure 29:
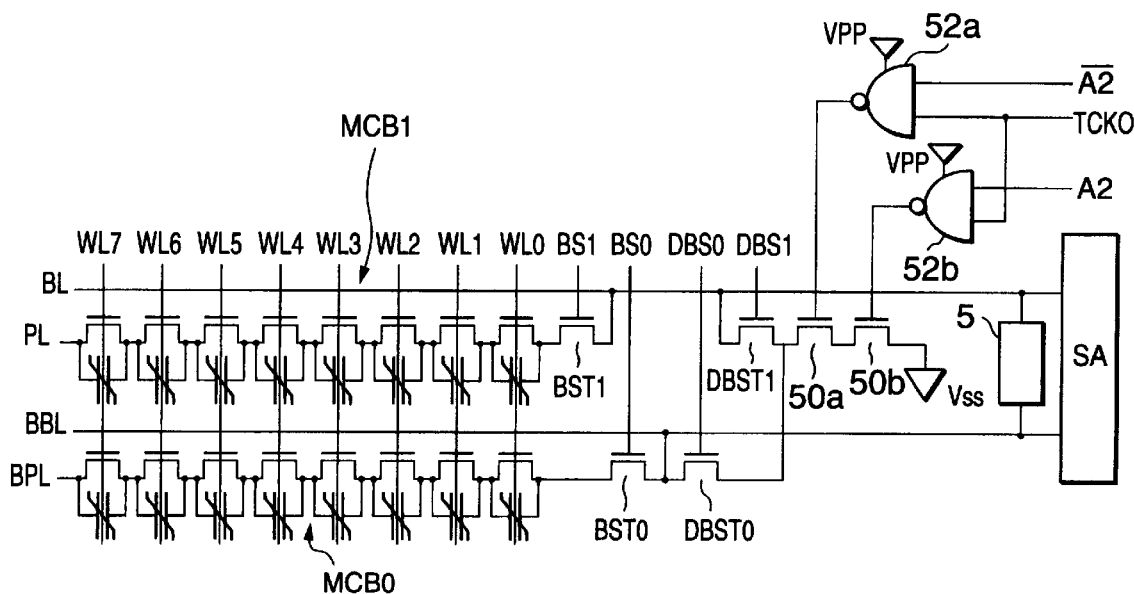
FIG. 29 is an equivalent circuit diagram showing a modification of the ferroelectric memory device according to the third embodiment of the present invention.

Next, a modification of the third embodiment will be described with reference to FIGS. 29 and 30. In this modification, the dummy cell block DMCB in the third embodiment is replaced with transistors 50a and 50b, and NAND gates 52a and 52b for driving these transistors 50a and 50b are additionally provided. One end of the transistor 50a is selectively connected to the bit lines BBL and BL via gate selecting transistors DBST0 and DBST1, respectively. The other end of the transistor 50a is connected to one end of the transistor 50b. The other end of the transistor 50b is grounded. Gates of the transistors 50a and 50b are connected to the output terminals of the NAND gates 52a and 52b. An inverted bit /A of the most significant bit A2 of a three bit address A2A1A1 for selecting one from the word lines WL0 to WL7, and an activating signal TCK0 are inputted to the NAND gate 52a, and the bit A2 and the activating signal TCK0 are inputted to the NAND gate 52b.

In this embodiment, when the address bit A2 is "1", i.e., when one of the word lines WL4 to WL7 is selected, the transistor 50a is turned on, and the transistor 50b is turned off. Further, when the address bit A2 is "0", i.e., when one of the word lines WL0 to WL3 is selected, the transistor 50a is turned off, and the transistor 50b is turned on.

Figure 30:
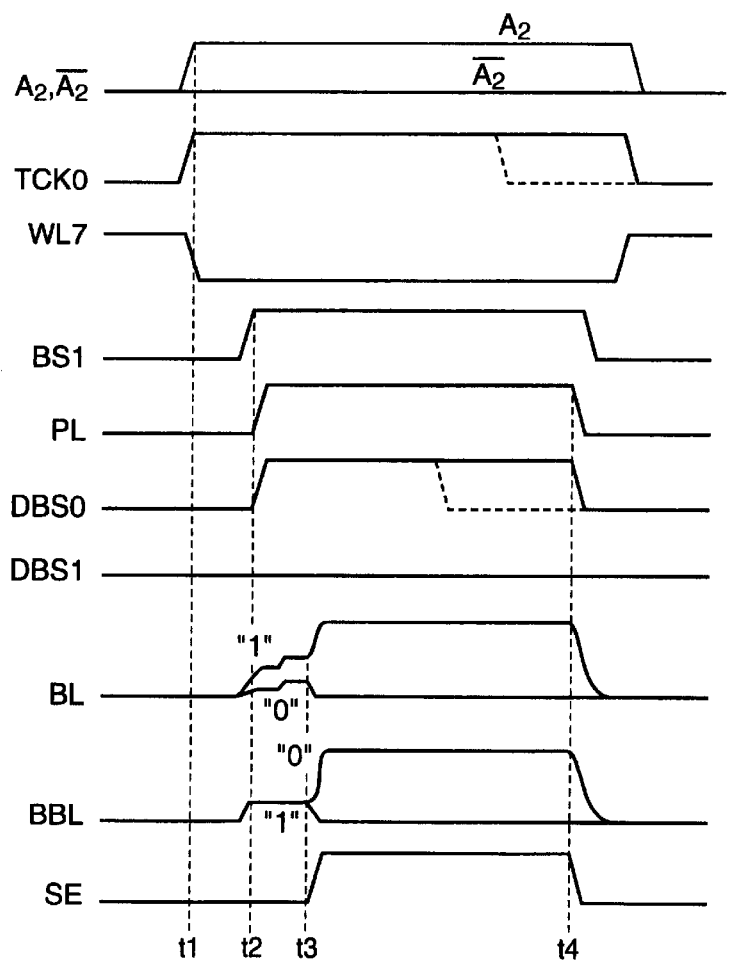
FIG. 30 is an operational timing chart of the modification shown in FIG. 29.

FIG. 30 is a timing chart showing the operations of this modified embodiment. In a standby mode, while the word lines WL0 to WL7 are held to be at "H", the transistors 50a and 50b are also held to be at "H". In an active mode, when one of the word lines WL0 to WL3 is set to be at "L", the gate of the transistor 50a is set to be at "L", and when one of the word lines WL4 to WL7 is set to be at "L", the gate of the transistor 50b is set to be at "L". FIG. 30 shows the case where the cell block MCB1 is selected and the word line WL7 is selected. At the same time as the word line WL7 is selected, the transistor 50a is selected (time t1). At the same time as the block selecting signal BS1 is set to be at "H" to select the cell block MCB1, the block selecting signal DBS0 is set to be at "H" to connect the transistors 50a and 50b to the bit line BBL (time t2).

In this way, the unit cell of the cell block MCB1 selected by the word line WL7 is connected to the bit line BL, and at the same time, the transistor 50b driven by the NAND gate 52b is connected to the reference side bit line BBL. A reference potential Vref is supplied to the reference side bit line BBL from the reference potential generating circuit 5 shown in FIG. 29. By activating a sense amplifier, it is determined whether the data is "0" data or "1" data (time t3). Then, as in the cases of the third embodiment, the plate line PL is set to be at "L" to rewrite the read data, and the sense amplifier 2 is deactivated (time t4).

In this modification, in the operation to read the cell lock MCB, when a parasitic capacitance, which may vary depending on the position of the selected word line, of the cell block is connected to the bit line BL, a parasitic capacitance, which may also vary depending on the position of the selected word line, is also connected to the reference side bit line BBL by the transistors 50a and 50b. In other words, this means that the reference potential Vref applied to the reference side bit line is substantially changed in accordance with the position of the selected word line in the cell block. As a result, the imbalance in signal value depending on the position of the selected word line is compensated.

In this modification, a dummy block only includes the transistors 50a and 50b, and it is not required to perform rewriting operation, etc. Accordingly, as shown by a broken line in FIG. 29, after the sense amplifier 2 is activated to confirm the data, the selected block selecting signal DBS0 may be set to be at "L", or the activating signal TCK0 may be set to be at "L".

As mentioned previously, according to the present invention, the imbalance in signal margin of "0" and "1" data, caused by the variations in load depending on the position of the selected word line, in a series connected TC unit type ferroelectric memory device can be compensated. As a result, it is possible to achieve a substantially constant signal margin regardless of the position of the selected word line.

What is claimed is:

1. A ferroelectric memory device comprising:
a memory cell array including:
a plurality of unit cells each having a cell transistor and a ferroelectric capacitor, a source and a drain of the cell transistor being connected to both ends of the ferroelectric capacitor, and a gate of the cell transistor being connected to a word line; and
a plurality of cell blocks each having a first terminal, a second terminal, and the unit cells series-connected between said first terminal and said second-terminal, said first terminal being connected to a bit line via a block selecting transistor, and said second terminal being connected to a plate line;
a sense amplifier for sensing and amplifying a signal read from the ferroelectric capacitor of the unit cell to the bit line;
a plate line driving circuit for driving the plate line; and
an offset voltage applying circuit for, when data is read and before said sense amplifier is activated, applying to said bit line different offset voltages in accordance with positions of the selected unit cells in the cell block,
wherein said offset voltage applying circuit applies a higher offset voltage to the bit line, to which a selected unit cell is connected, when said selected unit cell is more distant from the bit line than a predetermined unit cell.

2. A ferroelectric memory device comprising:
a memory cell array including:
a plurality of unit cells each having a cell transistor and a ferroelectric capacitor, a source and a drain of the cell transistor being connected to both ends of the ferroelectric capacitor, and a gate of the cell transistor being connected to a word line; and
a plurality of cell blocks each having a first terminal, a second terminal, and the unit cells series-connected between said first terminal and said second terminal, said first terminal being connected to a bit line via a block selecting transistor, and said second terminal being connected to a plate line;
a sense amplifier for sensing and amplifying a signal read from the ferroelectric capacitor of the unit cell to the bit line;
a plate line driving circuit for driving the plate line; and
an offset voltage applying circuit for, when data is read and before said sense amplifier is activated, applying to said bit line different offset voltages in accordance with positions of the selected unit cells in the cell block,
wherein said offset voltage applying circuit applies a lower offset voltage to a reference bit line, which is paired with the bit line to which a selected unit cell is connected, when said selected unit cell is more distant from the bit line than a predetermined unit cell.

3. A ferroelectric memory device comprising:
   a memory cell array including:
   a plurality of unit cells each having a cell transistor and a ferroelectric capacitor, a source and a drain of the cell transistor being connected to both ends of the ferroelectric capacitor, and a gate of the cell transistor being connected to a word line; and
   a plurality of cell blocks each having a first terminal, a second terminal, and the unit cells series-connected between said first terminal and said second terminal, said first terminal being connected to a bit line via a block selecting transistor, and said second terminal being connected to a plate line;
   a sense amplifier for sensing and amplifying a signal read from the ferroelectric capacitor of the unit cell to the bit line;
   a plate line driving circuit for driving the plate line; and
   an offset voltage applying circuit for, when data is read and before said sense amplifier is activated, applying to said bit line different offset voltages in accordance with positions of the selected unit cells in the cell block,
   wherein said offset voltage applying circuit applies an offset voltage to the bit line by capacitive coupling achieved by supplying a driving voltage to one end of at least one capacitor, the other end of which is connected to the bit line.

4. The ferroelectric memory device according to claim 3, wherein said offset voltage applying circuit includes a plurality of capacitors, one end of each capacitor being connected to the bit line, and a plurality of decoding gates connected to the other ends of the capacitors for supplying a driving voltage in accordance with a position of a selected word line.

5. The ferroelectric memory device according to claim 3, wherein said offset voltage applying circuit includes a capacitor, one end of which is connected with the bit line, a plurality of driving transistors connected to the other end of said capacitor, each supplying a different driving voltage, and a plurality of decoding gates for selecting a driving transistor in accordance with a position of a selected word line.

6. A ferroelectric memory device comprising:
   a memory cell array including:
   a plurality of unit cells each having a cell transistor and a ferroelectric capacitor, a source and a drain of the cell transistor being connected to both ends of the ferroelectric capacitor, and a gate of the cell transistor being connected to a word line; and
   a plurality of cell blocks each having a first terminal, a second terminal, and the unit cells series-connected between said first terminal and said second terminal, said first terminal being connected to a bit line via a block selecting transistor, and said second terminal being connected to a plate line;
   a sense amplifier for sensing and amplifying a signal read from the ferroelectric capacitor of the unit cell to the bit line;
   a plate line driving circuit for driving the plate line; and
   an offset voltage applying circuit for, when data is read and before said sense amplifier is activated, applying to said bit line different offset voltages in accordance with positions of the selected unit cells in the cell block,
   wherein said offset voltage applying circuit applies an offset voltage to the bit line, to which a selected unit cell in the cell block is connected, if more than a predetermined number of unit cells exist between the selected unit cell and the bit line.

7. The ferroelectric memory device according to claim 6, wherein said offset voltage applying circuit applies an offset voltage to the bit line by capacitive coupling achieved by supplying a driving voltage to one end of at least one capacitor, the other end of which is connected to the bit line.

8. The ferroelectric memory device according to claim 6, wherein said offset voltage applying circuit includes a plurality of capacitors, one end of each capacitor being connected to the bit line, and a plurality of decoding gates connected to the other ends of said capacitors for supplying a driving voltage in accordance with a position of a selected word line.

9. The ferroelectric memory device according to claim 6, wherein said offset voltage applying circuit includes a capacitor, one end of which is connected with the bit line, a plurality of driving transistors connected to the other end of said capacitor, each driving transistor supplying a different driving voltage, and a plurality of decoding gates for selecting a driving transistor in accordance with a position of a selected word line.

10. A ferroelectric memory device comprising:
    a memory cell array including:
    a plurality of unit cells each having a cell transistor and a ferroelectric capacitor, a source and a drain of the cell transistor being connected to both ends of the ferroelectric capacitor, and a gate of the cell transistor being connected to a word line; and
    a plurality of cell blocks each having a first terminal, a second terminal, and the unit cells series-connected between said first terminal and said second terminal, said first terminal being connected to a bit line via a block selecting transistor, and said second terminal being connected to a plate line;
    a sense amplifier for sensing and amplifying a signal read from the ferroelectric capacitor of the unit cell to the bit line;
    a plate line driving circuit for driving the plate line; and
    an offset voltage applying circuit for, when data is read and before said sense amplifier is activated, applying to said bit line different offset voltages in accordance with positions of the selected unit cells in the cell block,
    wherein said offset voltage applying circuit applies an offset voltage to a reference bit line paired with the bit line to which a selected unit cell in the cell block is connected, if less than a predetermined number of unit cells exist between the selected unit cell and the bit line.

11. The ferroelectric memory device according to claim 10, wherein said offset voltage applying circuit applies an offset voltage to the bit line by capacitive coupling achieved by supplying a driving voltage to one end of at least one capacitor, the other end of which is connected to the bit line.

12. The ferroelectric memory device according to claim 11, wherein said offset voltage applying circuit includes a plurality of capacitors, one end of each capacitor being connected to the bit line, and a plurality of decoding gates connected to the other ends of said capacitors for supplying a driving voltage in accordance with a position of a selected word line.

13. The ferroelectric memory device according to claim 11, wherein said offset voltage applying circuit includes a capacitor, one end of which is connected with the bit line, a plurality of driving transistors connected to the other end of said capacitor, each driving transistor supplying a different driving voltage, and a plurality of decoding gates for selecting a driving transistor in accordance with a position of a selected word line.

14. A ferroelectric memory device comprising:
a memory cell array including:
a plurality of unit cells each having a cell transistor and a ferroelectric capacitor, a source and a drain of the cell transistor being connected to both ends of the ferroelectric capacitor, and a gate of the cell transistor being connected to a word line; and
a plurality of cell blocks each having a first terminal, a second terminal, and the unit cells series-connected between said first terminal and said second terminal, said first terminal being connected to a bit line via a block selecting transistor, and said second terminal being connected to a plate line;
a sense amplifier for sensing and amplifying a signal read from the ferroelectric capacitor of the unit cell to the bit line;
a plate line driving circuit for driving the plate line;
an offset voltage applying circuit for, when data is read and before said sense amplifier is activated, applying to said bit line different offset voltages in accordance with positions of the selected unit cells in the cell block; and
a reference potential generating circuit, which, when data is read, applies a reference potential to a reference bit line paired with the selected bit line by capacitive coupling of capacitors.

15. A ferroelectric memory device comprising:
a memory cell array including:
a plurality of unit cells each having a cell transistor and a ferroelectric capacitor, a source and a drain of the cell transistor being connected to both ends of the ferroelectric capacitor, and a gate of the cell transistor being connected to a word line; and
a plurality of cell blocks each having a first terminal, a second terminal, and the unit cells series-connected between said first terminal and said second terminal, said first terminal being connected to a bit line via a block selecting transistor, and said second terminal being connected to a plate line;
a sense amplifier for sensing and amplifying a signal read from the ferroelectric capacitor of the unit cell to the bit line;
a plate line driving circuit for driving the plate line; and
a precharge circuit for setting, in a standby mode, internal nodes of the cell block to be at a first potential which is somewhere between signal potentials of binary data read to the bit line,
wherein said precharge circuit precharges the internal nodes of the cell block to be at the first potential via the plate line, and said plate line driving circuit and said precharge circuit area integrated with each other as a voltage generating circuit which generates the first potential in a standby mode, and generates a second potential higher than the first potential and a third potential lower than the first potential, which are sequentially applied to the ferroelectric capacitor of the selected unit cell, in an active mode.

16. A ferroelectric memory device comprising:
a memory cell array including:
a plurality of unit cells each having a cell transistor and a ferroelectric capacitor, a source and a drain of the cell transistor being connected to both ends of the ferroelectric capacitor, and a gate of the cell transistor being connected to a word line; and
a plurality of cell blocks each having a first terminal, a second terminal, and the unit cells series-connected between said first terminal and said second terminal, said first terminal being connected to a bit line via a block selecting transistor, and said second terminal being connected to a plate line;
a sense amplifier for sensing and amplifying a signal read from the ferroelectric capacitor of the unit cell to the bit line;
a plate line driving circuit for driving the plate line;
a precharge circuit for setting, in a standby mode, internal nodes of the cell block to be at a first potential which is somewhere between signal potentials of binary data read to the bit line; and
a reference potential generating circuit, which, when data is read, applies a reference potential to a reference bit line paired with the selected bit line by capacitive coupling of capacitors.

17. A ferroelectric memory device comprising:
a memory cell array including:
a plurality of unit cells each having a cell transistor and a ferroelectric capacitor, a source and a drain of the cell transistor being connected to both ends of the ferroelectric capacitor, and a gate of the cell transistor being connected to a word line; and
a plurality of cell blocks each having a first terminal, a second terminal, and the unit cells series-connected between said first terminal and said second terminal, said first terminal being connected to a bit line via a block selecting transistor, and said second terminal being connected to a plate line;
a sense amplifier for sensing and amplifying a signal read from the ferroelectric capacitor of the unit cell to the bit line;
a plate line driving circuit for driving the plate line; and
a dummy cell block for, when data is read, applying a parasitic capacitance, which varies in accordance with a position of a selected unit cell, to a reference bit line paired to the bit line to which the selected unit cell is connected.

18. The ferroelectric memory device according to claim 17, wherein said dummy cell block includes a plurality of series-connected dummy cell transistors, the number of which is the same as the number of the unit cells in the cell block, gates of the dummy cell transistors are connected to dummy word lines, and a dummy word line corresponding to the selected word line in the cell blocks is simultaneously selected.

19. The ferroelectric memory device according to claim 18, wherein said dummy cell block applies a greater parasitic capacitance to the reference bit line paired with the bit line to which a selected unit cell is connected, when the selected unit cell is more distant from the bit line than a predetermined unit cell in the cell block.

20. The ferroelectric memory device according to claim 18, wherein said dummy cell block applies a parasitic capacitance to the reference bit line paired with the bit line to which a selected unit cell in the cell block is connected, if more than a predetermined number of unit cells exist between the selected unit cell and the bit line in the cell block.

21. The ferroelectric memory device according to claim 17, further comprising a reference potential generating circuit, which, when data is read, applies a reference potential to a reference bit line paired with the selected bit line by capacitive coupling of capacitors.

* * * * *

UNITED STATES PATENT AND TRADEMARK OFFICE
CERTIFICATE OF CORRECTION

PATENT NO.   : 6,493,251 B2
DATED        : December 10, 2002
INVENTOR(S)  : Katsuhiko Hoya et al.

It is certified that error appears in the above-identified patent and that said Letters Patent is hereby corrected as shown below:

<u>Column 18,</u>
Line 24, "second-terminal" has been replaced with -- second terminal --;

<u>Column 21,</u>
Line 54, "area" has been replaced with -- are --.

Signed and Sealed this

Sixth Day of May, 2003

JAMES E. ROGAN
*Director of the United States Patent and Trademark Office*